United States Patent
Mangold et al.

(10) Patent No.: US 11,898,075 B2
(45) Date of Patent: Feb. 13, 2024

(54) YELLOW LIGHT EMITTING DEVICE

(71) Applicant: BASF SE, Ludwigshafen am Rhein (DE)

(72) Inventors: Hannah Stephanie Mangold, Ludwigshafen (DE); Sorin Ivanovici, Ludwigshafen (DE); Martin Koenemann, Ludwigshafen (DE); Siang Fu Hong, Taoyuan (TW); Chia Wei Tsai, Taipei (TW); Yen Te Lee, Taoyuan (TW); Wei Cheng Chou, Taoyuan (TW)

(73) Assignee: BASF SE

( * ) Notice: Subject to any disclaimer, the term of this patent is extended or adjusted under 35 U.S.C. 154(b) by 815 days.

(21) Appl. No.: 16/982,423

(22) PCT Filed: Mar. 19, 2019

(86) PCT No.: PCT/EP2019/056774
§ 371 (c)(1),
(2) Date: Sep. 18, 2020

(87) PCT Pub. No.: WO2019/179981
PCT Pub. Date: Sep. 26, 2019

(65) Prior Publication Data
US 2021/0054268 A1  Feb. 25, 2021

(30) Foreign Application Priority Data
Mar. 20, 2018  (EP) .................................... 18162913

(51) Int. Cl.
C09K 11/06    (2006.01)
C09K 11/02    (2006.01)
H01L 33/50    (2010.01)

(52) U.S. Cl.
CPC .............. C09K 11/06 (2013.01); C09K 11/02 (2013.01); H01L 33/502 (2013.01);
(Continued)

(58) Field of Classification Search
CPC . C09K 11/06; C09K 11/02; C09K 2211/1007; C09K 2211/1018;
(Continued)

(56) References Cited

U.S. PATENT DOCUMENTS 2,551,731 A    5/1951    Drewitt et al.
4,379,934 A    4/1983    Graser et al.
(Continued)

FOREIGN PATENT DOCUMENTS

EP    0 634 445 A1    1/1995
EP    3 072 887 A1    9/2016
(Continued)

OTHER PUBLICATIONS

International Search Report dated Jun. 5, 2019 in PCT/EP2019/056774 filed on Mar. 19, 2019.
(Continued)

*Primary Examiner* — Andrew J. Oyer
(74) *Attorney, Agent, or Firm* — Faegre Drinker Biddle & Reath LLP

(57) ABSTRACT

A yellow light emitting device may have a light source and a color converter wherein at most 1% of the total emitted radiant power of the yellow light emitting device is emitted in a wavelength range shorter than 520 nm, as well as the use of the yellow light emitting device.

19 Claims, 1 Drawing Sheet

(52) U.S. Cl.
CPC ............... *C09K 2211/1007* (2013.01); *C09K 2211/1018* (2013.01); *H01L 2933/0091* (2013.01)

(58) Field of Classification Search
CPC .... C09K 2211/1011; C09K 2211/1044; H01L 33/502; H01L 2933/0091; Y02B 20/00
See application file for complete search history.

(56) References Cited

U.S. PATENT DOCUMENTS

| | | | |
|---|---|---|---|
| 4,446,324 A | 5/1984 | Graser | |
| 4,845,223 A | 7/1989 | Seybold et al. | |
| 5,085,946 A | 2/1992 | Saito et al. | |
| 5,998,925 A | 12/1999 | Shimizu et al. | |
| 6,245,259 B1 | 6/2001 | Höhn et al. | |
| 6,429,583 B1 | 8/2002 | Levinson et al. | |
| 6,576,930 B2 | 6/2003 | Reeh et al. | |
| 6,669,866 B1 | 12/2003 | Kummer et al. | |
| 6,765,237 B1 | 7/2004 | Doxsee et al. | |
| 6,809,347 B2 | 10/2004 | Tasch et al. | |
| 6,812,500 B2 | 11/2004 | Reeh et al. | |
| 6,943,380 B2 | 9/2005 | Ota et al. | |
| 7,267,787 B2 | 9/2007 | Dong et al. | |
| 7,311,858 B2 | 12/2007 | Wang et al. | |
| 2011/0282020 A1 | 11/2011 | Sipos | |
| 2011/0306804 A1 | 12/2011 | Cortright | |
| 2014/0103374 A1* | 4/2014 | Koenemann | C09K 11/02 546/52 |
| 2014/0336349 A1 | 11/2014 | Sipos et al. | |
| 2016/0284947 A1 | 9/2016 | Koenemann et al. | |
| 2019/0023905 A1* | 1/2019 | Koenemann | B41M 3/144 |

FOREIGN PATENT DOCUMENTS

| | | |
|---|---|---|
| JP | 2004-6064 A | 1/2004 |
| WO | WO 02/11214 A1 | 2/2002 |
| WO | WO 2005/052087 A1 | 6/2005 |
| WO | WO 2007/006717 A1 | 1/2007 |
| WO | WO 2009/037283 A1 | 3/2009 |
| WO | WO 2010/132740 A2 | 11/2010 |
| WO | WO 2011/043660 A2 | 4/2011 |
| WO | WO 2011/043661 A1 | 4/2011 |
| WO | WO 2012/152812 A1 | 11/2012 |
| WO | WO 2012/168395 A1 | 12/2012 |
| WO | WO 2014/122549 A1 | 8/2014 |
| WO | WO 2015/019270 A1 | 2/2015 |
| WO | WO 2015/137804 A1 | 9/2015 |
| WO | WO 2017/121833 A1 | 7/2017 |
| WO | WO 2018/065502 A1 | 4/2018 |
| WO | WO 2018/134263 A1 | 7/2018 |

OTHER PUBLICATIONS

International Preliminary Report on Patentability dated Jan. 20, 2020 in PCT/EP2019/056774 filed on Mar. 19, 2019.
"I,8-Naphthoilene-1 ,2-benzimidazole (luminor yellow-green 490 rt)," Chem-Info, Jan. 1, 2008, http://www.chem-info.com/trade/sell/l, 8-Naphthoilene-l,2-benzimidazole-%28luminor-yellow-green-490-rt%29-313820.html, total 1 page, XP002679400.

* cited by examiner

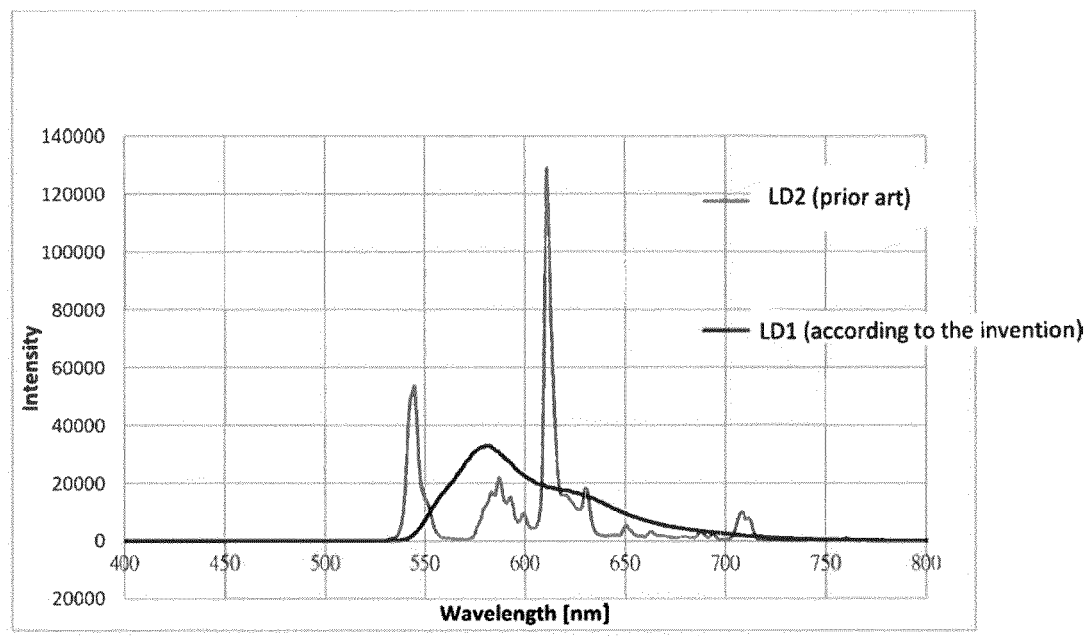

YELLOW LIGHT EMITTING DEVICE

The present invention relates to a yellow light emitting device comprising a light source and a color converter, wherein at most 1% of the total emitted radiant power of the yellow light emitting device is emitted in a wavelength range shorter than 520 nm. The present invention also relates to the use of said yellow light emitting device in a workspace for handling material which is sensitive to light at wavelengths below 520 nm and to a method for providing yellow light wherein at most 1% of the total radiant power is within the spectral range shorter than 520 nm by using this yellow light emitting device.

BACKGROUND OF INVENTION

Photoresists are used in photolithographic structuring of integrated circuits. Commercial photoresists are ordinarily sensitive to wavelengths ranging from near UV (ultraviolet) to about 460 nm in the visible spectrum. This sensitivity does not end abruptly but radiation sources emitting no or almost no radiation below 520 nm are considered safe for use in illuminating photolithographic rooms. When illuminating rooms for photolithographic applications, fluorescent lamps or light emitting diodes (LEDs) are usually used, which are covered with a filter to suppress nearly all wavelengths below 520 nm to avoid unwanted polymerisation of the photoresist during handling and processing of the photoresist. These lighting devices generate yellow light having almost no blue light. The prior art lighting devices with filter fail to achieve high efficiency, since the filter converts spectral components below 520 nm into heat. Thus, there is a great need for a yellow light emitting device with better efficiency.

The spectral output of an LED can be altered by means of a color converter comprising a phosphor material such as an organic fluorescent dye capable of absorbing light emitted from the LED and converting it to light of a longer wavelength. WO 2012/168395 describes a color converter used in combination with a blue LED to produce white light. The color converter comprises at least one polymer and at least one organic yellow-fluorescent colorant, wherein the organic fluorescent colorant comprises at least one structural unit of the formula (A),

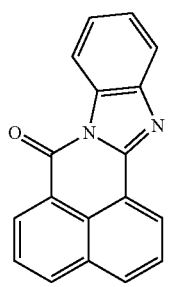

(A)

where the structural unit may be mono- or polysubstituted by identical or different substituents and where one or more CH groups in the six-membered ring of the benzimidazole structure shown may be replaced by nitrogen. This reference also describes color converters comprising at least one phosphor comprising at least one structural unit of formula (A) in combination with a red organic phosphor.

WO 2015/019270 describes core-cyanated naphthalene benzimidazole compounds and their use as yellow-fluorescent dyes, in particular their use in color converters for generating white light.

WO 2017/121833 describes perylene bisimides with rigid 2,2'-biphenoxy bridges and their use in color converters. This refence also describes color converters comprising the perylene bisimides with rigid 2,2'-biphenoxy bridges and a yellow organic fluorescent dye, and the use of these color converters in lighting devices for generating white light.

None of these references describes the use of a color converter comprising an organic fluorescent dye for use in lighting device which emits almost no light in a wavelength range of less than 520 nm.

It is therefore an object of the present invention to provide organic fluorescent dyes for use in color converters for lighting devices suitable for use in rooms, where material sensitive to light at wavelengths below 520 nm is handled, especially for room lighting in photolithography applications.

Preferably, the organic fluorescent dye should have one or more of the following characteristics:
excitable with light emitted from a blue LED;
broad emission spectrum above 520 nm;
high molar extinction coefficient;
high quantum yield;
high light stability under blue light and/or white light irradiation conditions;
high heat stability under blue light and/or white light irradiation conditions;
high chemical stability with respect to moisture and oxygen;
good extrusion processability;
good solution processability.

It was surprisingly found that these objectives can be achieved by a light emitting device comprising (i) a light source selected from a blue or white light emitting diode (LED) or combinations thereof and (ii) a color converter comprising at least one fluorescent dye comprising at least one structural unit of formula (I) as defined herein.

SUMMARY OF INVENTION

Thus, a first aspect of the present invention relates to a yellow light emitting device comprising
(i) a light source selected from at least one blue light emitting diode with a center wavelength of emission from 400 nm to 480 nm, at least one white light emitting diode having a correlated color temperature between 2 700 K and 30 000 K or a combination thereof; and
(ii) at least one color converter comprising at least one organic fluorescent dye in a polymer matrix and wherein said at least one organic fluorescent dye comprises at least one structural unit of formula (I)

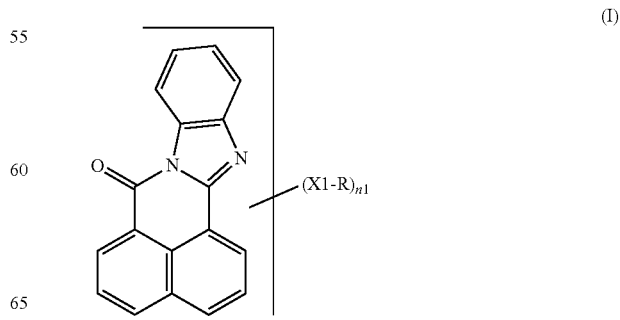

(I)

where one or more CH groups of the six-membered ring of the benzimidazole structure shown may be replaced by nitrogen and where the symbols are each defined as follows:

n1 is a number from 0 to (10-p1) for each structural unit of the formula (I); where p1 is the number of CH units which have been replaced by nitrogen in the six-membered ring of the benzimidazole structure shown X1 is a chemical bond, O, S, SO, $SO_2$, $NR^1$; and R is an aliphatic radical, cycloaliphatic radical, aryl, heteroaryl, each of which may bear substituents, an aromatic or heteroaromatic ring or ring system, each of which is fused to other aromatic rings of the structural unit of the formula (I) or is F, Cl, Br, CN or H when X1 is not a chemical bond;

where two R radicals may be joined to give one cyclic radical and where X1 and R, when n1>one, may be the same or different;

$R^1$ is each independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted;

aryl or heteroaryl which may be mono- or polysubstituted;

and mixtures thereof, wherein said at least one organic fluorescent dye comprising at least one structural unit of formula (I) absorbs at least a part of the light emitted by the light source and emits light comprising a wavelength in the range from 520 to 590 nm; and wherein the weight percentage of the at least one organic fluorescent dye comprising at least one structural unit of formula (I) in the color converter satisfies the equation (A)

$$20[\%\times\mu m] \leq w1 \times d \leq 100[\%\times\mu m] \qquad (A)$$

wherein w1 is the weight percentage of the at least one organic fluorescent dye comprising at least one structural unit of formula (I) in the polymer matrix based on the total weight of the polymer and d is the thickness of the color converter (μm);

wherein at most 1% of the total emitted radiant power of the yellow light emitting device is emitted in a wavelength range shorter than 520 nm; and wherein the yellow-light emitting device is characterized by a luminous efficiency of at least 80 lumen/watt.

The yellow light emitting device according to the invention is preferably used for room lighting in photolithography applications.

A special aspect of the present invention relates to a yellow light emitting device comprising (i) as light source at least one light emitting diode selected from a blue light emitting diode with a center wavelength of emission from 400 nm to 480 nm or a white light emitting diode having a correlated color temperature between 3 000 K and 30 000 K; and (ii) at least one color converter comprising at least one organic fluorescent dye in a polymer matrix and wherein said at least one organic fluorescent dye comprises at least one structural unit of formula (I)

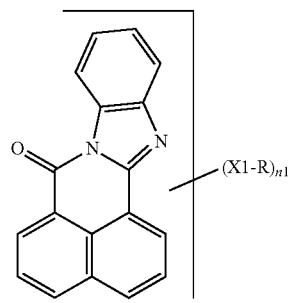

where one or more CH groups of the six-membered ring of the benzimidazole structure shown may be replaced by nitrogen and where the symbols are each defined as follows:

n1 is a number from 0 to (10-p1) for each structural unit of the formula (I); where p1 is the number of CH units which have been replaced by nitrogen in the six-membered ring of the benzimidazole structure shown X1 is a chemical bond, O, S, SO, $SO_2$, $NR^1$; and R is an aliphatic radical, cycloaliphatic radical, aryl, heteroaryl, each of which may bear substituents, an aromatic or heteroaromatic ring or ring system, each of which is fused to other aromatic rings of the structural unit of the formula (I) or is F, Cl, Br, CN or H when X1 is not a chemical bond;

where two R radicals may be joined to give one cyclic radical and where X1 and R, when n1>one, may be the same or different;

where $R^1$ is each independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted; aryl or heteroaryl which may be mono- or polysubstituted;

and mixtures thereof, wherein at most 1% of the total emitted radiant power of the yellow light emitting device is emitted in a wavelength range shorter than 520 nm.

According to a second aspect of the present invention there is provided the use of said yellow light emitting device as defined herein for illuminating a workspace for handling material which is sensitive to light at wavelengths below 520 nm.

According to a third aspect of the present invention there is provided a method for providing yellow light wherein at most 1% of the total radiant power is within the spectral range of less than 520 nm, the method comprising the steps (i) providing a light source selected from at least one blue light emitting diode with a center wavelength of emission from 400 nm to 480 nm, at least one white light emitting diode having a correlated color temperature between 2 700 K and 30 000 K or a combination thereof;

(ii) providing at least one color converter comprising at least one organic fluorescent dye in a polymer matrix and wherein said at least one organic fluorescent dye comprises at least one structural unit of formula (I)

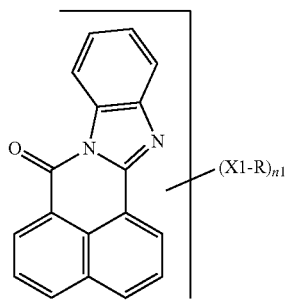

(I)

where one or more CH groups of the six-membered ring of the benzimidazole structure shown may be replaced by nitrogen and where the symbols are each defined as follows:

n1 is a number from 0 to (10-p1) for each structural unit of the formula (I); where p1 is the number of CH units which have been replaced by nitrogen in the six-membered ring of the benzimidazole structure shown X1 is a chemical bond, O, S, SO, $SO_2$, $NR^1$; and R is an aliphatic radical, cycloaliphatic radical, aryl, heteroaryl, each of which may bear substituents,
an aromatic or heteroaromatic ring or ring system, each of which is fused to other aromatic rings of the structural unit of the formula (I) or is F, Cl, Br, CN or H when X1 is not a chemical bond;

where two R radicals may be joined to give one cyclic radical and where X1 and R, when n1>one, may be the same or different;

$R^1$ is each independently hydrogen, $C_1$-$C_{18}$-alkyl or cycloalkyl, the carbon chain of which may comprise one or more —O—, —S—, —CO—, —SO— and/or —$SO_2$-moieties and which may be mono- or polysubstituted;

aryl or heteroaryl which may be mono- or polysubstituted;

and mixtures thereof, and wherein the at least one organic fluorescent dye comprising at least one structural unit of formula (I) is capable of absorbing at least a part of the light emitted by the light source and emitting light comprising a wavelength in the range from 520 to 590 nm and wherein the weight percentage of the at least one organic fluorescent dye comprising at least one structural unit of formula (I) in the color converter satisfies the equation (A)

$$20[\% \times \mu m] \leq w1 \times d \leq 100[\% \times \mu m] \quad (A)$$

wherein w1 is the weight percentage of the at least one organic fluorescent dye comprising at least one structural unit of formula (I) in the polymer matrix based on the total weight of the polymer and d is the thickness of the color converter (μm);

and (iii) arranging the color converter to receive at least a part of the light emitted by the light source.

Preferred embodiments of the present invention can be found in the description and the claims. Combinations of different embodiments fall within the scope of the present invention.

BRIEF DESCRIPTION OF THE FIGURES

FIG. 1 shows the emission intensity vs wavelength of a light emitting device according to the invention (LD1) and of a prior art light emitting device with filter (LD2).

DETAILED DESCRIPTION OF INVENTION

The invention described herein has several advantages:

The yellow light emitting device as defined herein can advantageously be used as a room light illumination for materials being sensitive to radiation below 520 nm, especially in semiconductor-manufacturing clean rooms.

The yellow light emitting device as defined herein can especially be used in the field of lithography, printed circuit boards and microelectronics for the clean room (yellow room) illumination.

The yellow light emitting device as defined herein has a higher luminous efficiency and thus lower electrical consumption than prior art yellow light emitting devices.

The yellow light emitting device as defined herein has a higher wall plug efficiency than prior art devices.

The advantages of the yellow light emitting device according to the invention results from the color converter comprising at least one organic fluorescent dye comprising at least one structural unit of formula I. Said fluorescent dye is capable of absorbing light emitted by a blue LED and white LED, respectively, and converting it to light of longer wavelength rather than absorbing wavelengths below 520 nm and converting them to heat as a filter does.

In the context of the present invention, the term "phosphor" can be a single phosphor or also be a phosphor mixture. The term "phosphor" relates to a wavelength-converting material that when excited by primary radiation, emits secondary radiation of different wavelength.

In the context of the present invention, the term "fluorescent colorants" include all materials which are capable of absorbing light of a particular wavelength and converting it to light of another wavelength. Organic fluorescent colorants may be organic fluorescent pigments or organic fluorescent dyes.

In the context of the present invention, the term "organic fluorescent dye" refers to an organic dye which absorbs light at a first wavelength and emits light at second wavelength which is longer than that of the absorbed wavelength.

In the context of the present invention, the term "inorganic luminescent material" refers to a material which absorbs light at a first wavelength and emits light at second wavelength which is longer than that of the absorbed light.

In the context of the present invention, the term "LED" or "light emitting diode" refers to a device having stack of inorganic semiconductor layers (a "chip"), including an active region which emits light when biased to produce an electrical current flow through the device, and contacts attached to the stack.

In the context of the present invention, the term "light emitting device" refers to a device that includes an LED and a color converter comprising at least one organic fluorescent dye in a polymer matrix, wherein the color converter is adapted to receive excitation light from the LED and emit light having a longer wavelength than the excitation light.

In the context of the present invention, the term "polymer matrix" refers to a polymer in which the organic fluorescent dye is dispersed or molecularly dissolved.

In the context of the present invention, the term "color converter", which is also referred to simply as "converter", are understood to mean all physical devices capable of absorbing light of particular wavelengths and converting it to light of a second (longer) wavelength. Color converters are, for example, part of lighting devices, especially those lighting devices which utilize blue LEDs as light source.

In contrast to color converters, light filters selectively transmit light in a particular range of wavelengths, while absorbing the remainder. Thus, filters are not capable of converting light having a shorter wavelength to light having a longer wavelength.

A quantum dot is a nanocrystal made of semiconductor materials that is small enough to exhibit quantum mechanical properties. Quantum dots are showing remarkably narrow emission spectra, i.e. with extraordinary small FWHM (full width of half maximum). The color output of the dots can be tuned by controlling the size of the crystals. With a smaller size in quantum dots, the quantum dots emit light of a shorter wavelength.

In the context of the present invention, a "blue LED" is understood to mean an LED which emits light in the blue range of the electromagnetic spectrum with a center wavelength of emission in the range of 400 to 480 nm, preferably 420 to 480, more preferably 440 to 475 nm, most preferably at 440 to 460 nm. Suitable semiconductor materials are silicon carbide, zinc selenide and nitrides such as aluminum nitride (AlN), gallium nitride (GaN), indium nitride (InN) and indium gallium nitride (InGaN). LEDs typically have a narrow wavelength distribution that is tightly centered about their peak wavelength. Standard InGaN-based blue LEDs are fabricated on a sapphire substrate and peak emission wavelength is usually centered at 445 to 455 nm.

In the context of the present invention, the terms "blue emission" or "blue light" refer to light having a wavelength in the range of about 400 to 480 nm.

In the context of the present invention, the term "having a wavelength" or "comprising a wavelength" indicates that the emission has a wavelength within the specified range.

In the context of the present invention, the term "white light emitting device" or "white LED" refers to a light emitting device that is capable of producing white light. "White light" refers to light that is perceived as white by a human observer. Particular embodiments of white light include light that has a color rendering index (CRI) of greater than about 85.

A "white light-emitting diode having a correlated color temperature between 2 700 K and 30 000 K" and 3°000 K and 30°000 K", respectively, is understood to mean a phosphor-converted white LED having a correlated color temperature between 2 700 and 30 000 K and 3°000 K and 30°000 K, respectively. The white light emitting diode is typically a phosphor-converted white LED. Phosphor-converted white LEDs include one or more photoluminescence materials (phosphor materials), which absorbs a part of the radiation emitted by the LED and re-emits light of a different wavelength (color), which is longer than that of the absorbed wavelength. Typically, the LED generates blue light and the phosphor(s) absorb(s) a part of the blue light and re-emit(s) yellow light or a combination of yellow light and/or red light. The portion of the blue light emitted by the LED that is not absorbed by the phosphor(s) combined with the light emitted by the phosphor(s) provides light which appears white to the human observer.

The phosphor material may be inorganic phosphor material and/or organic phosphor material (also referred to a organic fluorescent colorants or dyes). Presently, there are three concepts for realizing phosphor-converted white LEDs. One concept is to cover or coat a blue-emitting LED chip with the phosphor material. Since the phosphor is applied directly and without intervening space to the surface of the LED chip, this configuration is also referred to as "phosphor on chip" configuration. The phosphor on chip configuration requires a very high thermal and photochemical stability of the phosphors. Hence, the phosphors most commonly used are inorganic ones such as inorganic oxides doped with rare earth ions. The most widely used and commerically available white LED is based on the emission of blue light from an InGaN chip coated with cerium-doped yttrium aluminium garnet (Ce:YAG) phosphor (emission in the yellow spectral range (around 560 nm)). It goes without saying that other yellow phosphors such as a BOSE phosphor $(BaSr)_2SiO_2:Eu^{2+}$ may be used instead of Ce:YAG. A blend of yellow inorganic phosphor and orange-red inorganic phosphor (wavelength longer than 600 nm) such as nitride phosphors may also be used to overcome the lack of red emission. According to another concept the phosphor material is dissolved or dispersed in a polymeric matrix which is at a certain distance from the blue LED chip. This structure is referred to as "remote phosphor". Since the remote phosphor material is mounted a sufficient distance from the blue LED light source, substantially no heat from the light source passes into the remote phosphor material. Hence, the remote phosphor material can be an organic one.

According to a further concept, the white phosphor-converted LED is a phosphoron chip LED made of a blue-emitting LED chip and an inorganic yellow phosphor such as cerium-doped yttrium aluminium garnet in combination with a color converter comprising at least one organic fluorescent compound, where the phosphor-on a chip LED and the color converter are in a spatial distance (remote phosphor arrangement).

In the context of the present invention, the terms "yellow emission" or "yellow light" refer to light having a wavelength equal to or longer than 520 nm, i.e. light wherein at most 1% of the total spectral power distribution is below 520 nm.

In the context of the present invention, the term "yellow light emitting device" refers to a light emitting device which generates almost no short-wavelength blue light, i.e. at most 1% of the total spectral power distribution is below 520 nm.

In the context of the present invention, the term "radiant power" is defined as the energy per unit time (dQ/dt) that is radiated from a source over optical wavelengths.

The unit of the radiant power is W (watt). Radiant power is sometimes also called radiant flux. It is measured using an integrating sphere with a spectraphotometer.

In the context of the present invention, the term "spectral power distribution" (SPD) describes the power (strength) of each wavelength of light produced by a particular light source, i.e. the distribution of spectral power versus wavelength.

In the context of the present invention, the term "center wavelength" of a given spectral distribution $F(\lambda)$ is defined as the following average: $\lambda_c = \int \lambda \cdot F(\lambda) d\lambda / \int F(\lambda) d\lambda$.

In the context of the present invention, the term "fluorescence quantum yield (QY)" is defined as ratio of the number of photons emitted to the number of photons absorbed.

The correlated color temperature (CCT), measured in Kelvin, typically describes the color appearance of white light emitted from electric light sources. It is determined according to the CIE international standard. White light having higher CCT contains relatively higher intensity in the short wavelength region (blue) and relatively lower intensity in the longer wavelength region (red) compared to white light with lower CCT.

According to the CIE 1931 standard colorimetric system, colors are perceived by human eye following specific color curves. The standard luminosity curve $V_\lambda$ accounts for the wavelength dependence of the sensitivity of human eye.

The conversion efficiency of electrical power to optical power is called the wall-plug efficiency (WPE). It is defined as the ratio of the total optical output power to the input electrical power.

Luminous flux (LF) is the measure of the perceived power of light. Luminous flux is usually measured using an integrating sphere. Light outside the visible band does not contribute.

Luminous efficiency, measured in lumen per watt, is a measure of how efficient a light source produces light. It is the luminous flux divided by electrical power.

In the context of the present invention, an electromagnetic radiation comprising the visible spectral range is also designated as light.

As used in this specification and the claims, the singular form "a", "an" and "the" includes plural references unless the content clearly dictates otherwise.

The word "essentially" in the context of the present invention encompasses the words "completely", "wholly" and "all". The word encompasses a proportion of 90% or more, such as 95% or more, especially 99% or 100%.

Here and throughout the specification, the prefixes $C_n$-$C_m$ used in connection with compounds or molecular moieties each indicate a range for the number of possible carbon atoms that a molecular moiety or a compound can have.

The term "halogen" denotes in each case fluorine, bromine, chlorine or iodine.

The term "aliphatic radical", as used herein, refers to an acyclic saturated or unsaturated, straight-chain or branched hydrocarbon radical. Usually, the aliphatic radical has 1 to 100 carbon atoms. Examples for an aliphatic radical are alkyl, alkenyl and alkynyl.

The term "cycloaliphatic radical", as used herein, refers to a cyclic, non-aromatic saturated or unsaturated hydrocarbon radical having usually 3 to 20 ring carbon atoms.

Examples are cycloalkanes, cycloalkenes, and cycloalkynes. The cycloaliphatic radical may also comprise heteroatoms or heteroatom groups selected from N, O, S and $SO_2$ The term "alkyl" as used herein refers to saturated straight-chain or branched hydrocarbon radicals having 1 to 30 ("$C_1$-$C_{30}$-alkyl"), 1 to 18 ("$C_1$-$C_{18}$-alkyl"), 1 to 12 ("$C_1$-$C_{12}$-alkyl"), 1 to 8 ("$C_1$-$C_8$-alkyl"), 1 to 6 ("$C_1$-$C_6$-alkyl"), 1 to 4 ("$C_1$-$C_4$-alkyl") or 1 to 2 ("$C_1$-$C_2$-alkyl") carbon atoms. $C_1$-$C_2$-Alkyl is methyl or ethyl. $C_1$-$C_4$-Alkyl is additionally n-propyl, isopropyl, n-butyl, 1-methylpropyl (sec-butyl), 2-methylpropyl (isobutyl) or 1,1-dimethylethyl (tert-butyl). $C_1$-$C_6$-Alkyl is additionally also, for example, n-pentyl, 1-methylbutyl, 2-methylbutyl, 3-methylbutyl, 2,2-dimethylpropyl, 1-ethylpropyl, 1,1-dimethylpropyl, 1,2-dimethylpropyl, n-hexyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl, or 1-ethyl-2-methylpropyl. $C_1$-$C_6$-Alkyl is additionally also, for example, n-pentyl or n-hexyl.

The term "haloalkyl" as used herein, refers to a straight-chain or branched alkyl group having 1 to 6 ("$C_1$-$C_6$-haloalkyl") carbon atoms (as specified above), where some or all of the hydrogen atoms in these groups are replaced by halogen atoms as specified above. Examples are chloromethyl, bromomethyl, dichloromethyl, trichloromethyl, fluoromethyl, difluoromethyl, trifluoromethyl, chlorofluoromethyl, dichlorofluoromethyl, chlorodifluoromethyl, 1-chloroethyl, 1-bromoethyl, 1-fluoroethyl, 2-fluoroethyl, 2,2-difluoroethyl, 2,2,2-trifluoroethyl, 2-chloro-2-fluoroethyl, 2-chloro-2,2-difluoroethyl, 2,2-dichloro-2-fluoroethyl, 2,2,2-trichloroethyl, pentafluoroethyl, 1-fluoropropyl, 2-fluoropropyl, 3-fluoropropyl, 1,1-difluoropropyl, 2,2-difluoropropyl, 1,2-difluoropropyl, 3,3-difluoropropyl, 3,3,3-trifluoropropyl, heptafluoropropyl, 1,1,1-trifluoroprop-2-yl, 3-chloropropyl and the like.

The term "cycloalkyl" as used herein refers to mono- or bicyclic saturated hydrocarbon radicals having usually 3 to 8 ("$C_3$-$C_8$-cycloalkyl") or 3 to 6 carbon atoms ("$C_3$-$C_6$-cycloalkyl"). Examples of monocyclic radicals having 3 to 6 carbon atoms comprise cyclopropyl, cyclobutyl, cyclopentyl and cyclohexyl. Examples of monocyclic radicals having 3 to 8 carbon atoms comprise cyclopropyl, cyclobutyl, cyclopentyl, cyclohexyl, cycloheptyl and cyclooctyl. Examples of bicyclic radicals having 7 or 8 carbon atoms comprise bicyclo[2.2.1]heptyl, bicyclo[3.1.1]heptyl, bicyclo[2.2.2]octyl, bicyclo[3.3.0]octyl and bicyclo[3.2.1]octyl. Preferably, the term cycloalkyl denotes a monocyclic saturated hydrocarbon radical having 3 to 6 carbon atoms.

The term "alkenyl" as used herein refers to monounsaturated straight-chain or branched hydrocarbyl radicals having 2 to 30 ("$C_2$-$C_{30}$-alkenyl"), for example 2 to 20 ("$C_2$-$C_{20}$-alkenyl") or 3 to 10 ("$C_2$-$C_{10}$-alkenyl") carbon atoms and one double bond in any position, for example ethenyl, 1-propenyl, 2-propenyl, 1-methylethenyl, 1-butenyl, 2-butenyl, 3-butenyl, 1-methyl-1-propenyl, 2-methyl-1-propenyl, 1-methyl-2-propenyl, 2-methyl-2-propenyl.

The term "alkynyl" as used herein refers to straight-chain or branched hydrocarbyl radicals having 2 to 30 ($C_2$-$C_{30}$-alkynyl), for example 2 to 20 ("$C_2$-$C_{20}$-alkynyl") or 3 to 10 ("$C_2$-$C_{10}$-alkynyl") carbon atoms and one triple bond at any position, for example ethynyl, 1-propynyl, 2-propynyl, 1-butynyl, 2-butynyl, 3-butynyl, 1-methyl-2-propynyl.

The term "heterocyclyl" as used herein refers to a mono- or bicyclic saturated or partially unsaturated ring system having 3, 4, 5, 6, 7 or 8 ring members ($C_3$-$C_8$-heterocyclyl), comprising besides carbon atoms as ring members, one, two, three or four heteroatoms or heteroatom-containing groups selected from O, N, S, SO and $S(O)_2$ as ring members.

The term "aryl" as used herein refers to mono-, di- or trinuclear (monocyclic, bicyclic or tricyclic) aromatic hydrocarbyl radicals having 6 to 14 and more preferably 6 to 10 carbon atoms, which do not comprise any ring heteroatoms. Examples of aryl are especially phenyl, naphthyl, indenyl, fluorenyl, anthracenyl, phenanthrenyl, and especially phenyl or naphthyl.

The term "heteroaryl (hetaryl)" as used herein refers to a mono-, di- or trinuclear (monocyclic, bicyclic or tricyclic) aromatic ring system having 5 to 14 ring members, some of which can be derived from the aforementioned aryl, in which at least one carbon atom in the aryl base skeleton is replaced by a heteroatom. Preferred heteroatoms are N, O and S. More preferably, the heteroaryl radicals have 5 to 13 ring atoms. More preferably, the heteroaryl radicals have besides carbon atoms, one, two, three or four heteroatoms selected from O, S and N as ring members.

The term "alkylene" (or alkanediyl) as used herein in each case denotes an alkyl radical as defined above, wherein one hydrogen atom at any position of the carbon backbone is replaced by one further binding site, thus forming a bivalent moiety.

The term "$C_6$-$C_{14}$-aryl-$C_1$-$C_{10}$-alkylene" (which may also be referred to as aralkyl) as used herein refers to $C_6$-$C_{14}$-aryl-substituted alkyl radicals having at least one unsubstituted or substituted aryl group, as defined herein. The alkyl group of the aralkyl radical may be interrupted by one or more nonadjacent groups selected from O, S and $NR^a$, wherein $R^a$ is as defined above. $C_6$-$C_{14}$-aryl-$C_1$-$C_{10}$-alkylene is preferably phenyl-$C_1$-$C_{10}$-alkylene, more preferably phenyl-$C_1$-$C_4$-alkylene, for example benzyl, 1-phenethyl, 2-phenethyl, 1-phenprop-1-yl, 2-phenprop-1-yl, 3-phenprop-1-yl, 1-phenbut-1-yl, 2-phenbut-1-yl, 3-phenbut-1-yl, 4-phenbut-1-yl, 1-phenbut-2-yl, 2-phenbut-2-yl, 3-phenbut-2-yl or 4-phenbut-2-yl; preferably benzyl and 2-phenethyl.

Light Source (i)

In one embodiment of the invention, the light source is a blue LED with a center wavelength of emission from 400 to 480 nm.

In a further embodiment of the invention, the light source is a white LED having a correlated color temperature between 2 700 and 30 000 K, preferably 3 000 and 30 000 K. Preferably, the white LED has a correlated color temperature between 3 000 and 20 000 K. More preferably, the white LED has a correlated color temperature between 3 000 and 12 000 K. Exemplary white LEDs are white LEDs having a correlated color temperature between 4 000 and 12 000 K or white LEDs having a correlated color temperature between 4 500 and 12 000 K. White LEDs are commercially available.

Preferably, the inventive yellow light emitting device comprises a plurality of LEDs, all of which are blue ones. Likewise preferably, the inventive yellow light emitting device comprises a plurality of LEDs, all of which are white ones. Likewise preferably, the inventive yellow light emitting device comprises a plurality of LEDs, a part of them are blues one and a part of them are white ones.

Color Converter (ii)

The color converter is arranged for absorbing at least part of a first radiation from the light source and for converting a first wavelength of said first radiation into a second wavelength of a second radiation, wherein the second wavelength is longer than the first wavelength. The light emitted by the LED must in any case pass through the color converter.

Polymer Matrix

Preferably, the polymer matrix comprises a polymer selected from polystyrene, polycarbonate, polyacrylate, polymethylmethacrylate, polymethacrylate, polyvinylpyrrolidone, polyvinyl acetate, polyvinyl chloride, polybutene, silicone, epoxy resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, a 2,5-furandicarboxylate polyester, polyvinyl butyrate, polyvinyl chloride, polyamides, polyoxymethylenes, polyimides, polyetherimides or mixtures thereof.

Preferably, the polymer matrix consists essentially of polystyrene, polycarbonate, polyacrylate, polymethylmethacrylate, polymethacrylate, polyvinylpyrrolidone, polyvinyl acetate, polyvinyl chloride, polybutene, silicone, epoxy resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, a 2,5-furandicarboxylate polyester, polyvinyl butyrate, polyvinyl chloride, polyamides, polyoxymethylenes, polyimides, polyetherimides or mixtures thereof.

The term "silicone" is also known as term "(poly)siloxane".

In one embodiment of the first aspect of the invention, the polymer matrix comprises or consists of a transparent polymer. In another embodiment of the first aspect of the invention, the polymer matrix comprises or consists of an opaque polymer.

Especially, the polymer matrix material consists essentially or completely of polystyrene, polycarbonate, polyethylene terephthalate or polyethylene furanoate.

Polystyrene is understood here to mean, inter alia, all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene. In general, suitable polystyrenes have a mean molar mass Mn of 10 000 to 1 000 000 g/mol (determined by GPC), preferably 20 000 to 750 000 g/mol, more preferably 30 000 to 500 000 g/mol.

In a preferred embodiment of the first aspect of the invention, the matrix of the color converter consists essentially or completely of a homopolymer of styrene or styrene derivatives. More particularly, the polymer matrix material completely consists of polystyrene.

In a further preferred embodiments of the first aspect of the invention the invention, the polymer matrix material consists essentially or completely of a styrene copolymer, which are likewise regarded as polystyrene in the context of this application. Styrene copolymers may comprise, as further constituents, for example, butadiene, acrylonitrile, maleic anhydride, vinylcarbazole or esters of acrylic, methacrylic or itaconic acid as monomers. Suitable styrene copolymers generally comprise at least 20% by weight of styrene, preferably at least 40% and more preferably at least 60% by weight of styrene. In another embodiment, they comprise at least 90% by weight of styrene.

Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS). A further preferred polymer is alpha-methylstyrene-acrylonitrile copolymer (AMSAN). The styrene homo- or copolymers can be prepared, for example, by free-radical polymerization, cationic polymerization, anionic polymerization or under the influence of organometallic catalysts (for example Ziegler-Natta catalysis). This can lead to isotactic, syndiotactic or atactic polystyrene or copolymers. They are preferably prepared by free-radical polymerization. The polymerization can be performed as a suspension polymerization, emulsion polymerization, solution polymerization or bulk polymerization. The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and references cited therein; and in Elias, Macromolecules, Weinheim 2007, p. 269-275.

In another preferred embodiment of the first aspect of the invention, the polymer matrix material completely consists of polyethylene terephthalate. Polyethylene terephthalate is obtainable by condensation of ethylene glycol with terephthalic acid.

In another preferred embodiment of the first aspect of the invention, the polymer matrix material consists essentially or completely of polycarbonate. More preferably, the polymer matrix material completely consists of polycarbonate. Polycarbonates are polyesters of carbonic acid with aromatic or aliphatic dihydroxyl compounds. Preferred dihydroxyl compounds are, for example, methylenediphenylenedihydroxyl compounds, for example bisphenol A. One means of preparing polycarbonates is the reaction of suitable dihydroxyl compounds with phosgene in an interfacial polymerization. Another means is the reaction with diesters of carbonic acid such as diphenyl carbonate in a condensation polymerization. The preparation of suitable polycarbonates is described, for example, in Elias, Macromolecules, Weinheim 2007, p. 343-347.

Likewise more particularly, the polymer matrix material consists essentially or completely of 2,5-furandicarboxylate polyester. 2,5-Furandicarboxylate polyesters are obtainable by reacting (i) at least one diol selected from the group consisting of an aliphatic $C_2$-$C_2$-diol and a cycloaliphatic $C_3$-$C_{20}$-diol, with (ii) 2,5-furandicarboxylic acid and/or an ester forming derivative thereof and (iii) optionally at least one further dicarboxylic acid selected from the group consisting of 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof.

Suitable aliphatic $C_2$-$C_2$-diols are preferably linear or branched $C_2$-$C_{15}$-alkanediols, especially linear or branched $C_2$-$C_{10}$-alkanediols such as ethane-1,2-diol (ethylene glycol), propane-1,2-diol, propane-1,3-diol (propylene glycol), butane-1,3-diol, butane-1,4-diol (butylene glycol), 2-methyl-1,3-propanediol, pentane-1,5-diol, 2,2-dimethyl-1,3-propanediol (neopentyl glycol), hexane-1,6-diol, heptane-1,7-diol, octane-1,8-diol, nonane-1,9-diol, decane-1,10-diol, etc. Suitable cycloaliphatic $C_3$-$C_{20}$-diols are preferably $C_3$-$C_{10}$-cycloalkylenediols, such as 1,2-cyclopentanediol, 1,3-cyclopentanediol, 1,2-cyclohexanediol, 1,4-cyclohexanediol, 1,2-cycloheptanediol or 1,4-cycloheptanediol. Other suitable cycloaliphatic $C_3$-$C_2$-diols include 1,3-cyclohexane dimethanol and 1,4-cyclohexane dimethanol, or 2,2,4,4-tetramethyl-1,3-cyclobutanediol, or combinations thereof. Particularly preferred diols are $C_2$-$C_6$-alkanediols, in particular ethane-1,2-diol, propane-1,2-diol, propane-1,3-diol, butane-1,3-diol, butane-1,4-diol, pentane-1,5-diol, 2,2-dimethyl-1,3-propanediol and mixtures thereof. More particularly preferred are ethane-1,2-diol and propane-1,3-diol, especially ethane-1,2-diol.

More particularly preferred are also biologically derived ("bio-derived") $C_2$-$C_{10}$-alkanediols, especially $C_2$-$C_6$-alkanediols such as ethane-1,2-diol and propane-1,3-diol. Bio-based ethane-1,2-diol may be obtained from a lignocellulose biomass source by the conversion of the carbohydrates therein contained. Methods for preparing $C_2$-$C_{10}$-alkanediols from biomass are known in the art, for example from US 2011/0306804.

Preferably, the diol component (i) is made up exclusively of one diol mentioned as preferred, especially ethane-1,2-diol. The diol component (i) may also comprise two, three or more than three different diols. If two, three or more than three different diols are used, preference is given to those mentioned above as being preferred. In this case, based on the total weight of component (i), ethane-1,2-diol is preferably the major component.

Ester forming derivatives of 2,5-furandicarboxylic acids are especially $C_1$-$C_{10}$-dialkyl esters of 2,5-furandicarboxylic acid. Particularly preferred diesters are $C_1$-$C_6$-dialkyl esters of 2,5-furandicarboxylic acid, especially the dimethyl ester and diethyl ester. Component (ii) may also comprise two, three or more than three different diesters of 2,5-furandicarboxylic acid. 2,5-Furandicarboxylic acid can be produced from bio-based sugars. Routes for the preparation of 2,5-furandicarboxylic acid using air oxidation of 2,5-disubstituted furans such as 5-hydroxymethylfurfural with catalysts comprising Co, Mn and/or Ce were reported recently in WO 2010/132740, WO 2011/043660, WO 2011/043661, US 2011/0282020, US 2014/0336349 and WO 2015/137804. Routes for the preparation of dialkyl ester of 2,5-furandicarboxylic acid are also described for example in WO 2011/043661.

Preferably, the polymer is made up exclusively of (i) one diol selected from the group consisting of an aliphatic $C_2$-$C_{20}$-diol and a cycloaliphatic $C_3$-$C_{20}$-diol and (ii) a 2,5-furandicarboxylic acid or of diester(s) of 2,5-furandicarboxylic acid.

Preferably, the 2,5-furandicarboxylate polyester is selected from the group consisting of poly(ethylene-2,5-furandicarboxylate), poly(propylene-2,5-furandicarboxylate), poly(ethylene-co-propylene-2,5-furandicarboxylate), poly(butylene-2,5-furandicarboxylate), poly(pentylene-2,5-furandicarboxylate), poly(neopentylene-2,5-furandicarboxylate) and mixtures thereof. In particular, the polymeric matrix material for use in the color converter according to the invention can consist of or can consist essentially of from poly(ethylene-2,5-furandicarboxylate), poly(trimethylene-2,5-furandicarboxylate) and poly(butylene-2,5-furandicarboxylate). Especially, the polymeric matrix material for use in the color converter according to the invention consists of poly(ethylene-2,5-furandicarboxylate). In a further specific embodiment, the polymeric matrix material of the color converter comprises a mixture (blend) of different 2,5-furandicarboxylate polyesters as defined above, for example, a blend of poly(ethylene-2,5-furandicarboxylate) and poly(propylene-2,5-furandicarboxylate). Poly(propylene-2,5-furandicarboxylate) is also referred to as poly(trimethylene 2,5-furandicarboxylate); poly(butylene-2,5-furandicarboxylate) is also referred to as poly(tetramethylene 2,5-furan-dicarboxylate), poly(pentylene-2,5-furandicarboxylate) is also referred to as poly(pentamethylene 2,5-furan-dicarboxylate).

Likewise suitable are 2,5-furandicarboxylate polyesters obtainable by reacting at least one diol component (i) as defined above, component (ii) as defined above and at least one further diacid or diester component (iii) selected from the group consisting of 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof. Ester forming derivative of 1,2-cyclohexanedicarboxylic acid, 1,4-cyclohexanedicarboxylic acid, 3,4-furandicarboxylic acid, terephthalic acid and 2,6-naphthalic acid are especially the $C_1$-$C_{10}$-dialkyl ester. Particularly preferred esters are $C_1$-$C_6$-dialkyl ester, especially the dimethyl ester and diethyl ester. When using a combination of component (ii) and component (iii), component (ii) is the major component based on the total weight of component (ii) and (iii). Examples are poly(ethylene-2,5-furandicarboxylate-co-1,2-cyclohexanedicarboxylate), poly(ethylene-2,5-furandicarboxylate-co-1,4-cyclohexanedicarboxylate), poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate), preferably poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate.

The 2,5-furandicarboxylate polyester (A) can be prepared as described in U.S. Pat. No. 2,551,731.

Especially, the polymer matrix consists completely of polyethylene furanoate.

The Organic Fluorescent Dye Comprising at Least One Structural Unit of Formula (I)

The organic fluorescent dye (compound) comprising a structural unit of formula I completely or partially absorbs the light emitted from the light source and re-emits it in a longer wave form. Organic fluorescent dyes comprising a structural unit of formula I are known from WO 2012/168395. The organic fluorescent dyes comprising a structural unit of formula I usually absorbs light in a wavelength range from 400 to 500 nm which stems from a blue LED with a center wavelength of emission from 400 to 480 nm or a white LED having a correlated color temperature between 2 700 K and 30 000 K. Advantageously, they have a broad emission spectrum from 520 to 590 nm.

Preferred organic fluorescent dyes comprising at least one structural unit of formula (I) are those, wherein X1 is a single bond. With regard to the use in the color converter of the present invention, the dye having a structural unit of formula (I) is preferably a compound as specified in WO 2012/168395, at page 28, line 14 to page 32, line 5 and page 33, line 3 to page 37, line 10.

In a preferred embodiment of the invention, in the organic fluorescent dye having a structural unit of formula (I), (X1-R) is phenyl, naphthyl, anthracenyl, phenanthrenyl, pyrenyl, benzopyrenyl, fluorenyl, indanyl, indenyl, tetralinyl, phenoxy, each of which may be mono- or polysubstituted by identical or different radicals which are independently of each other selected from $C_1$-$C_{12}$-alkyl, $C_1$-$C_{12}$-alkoxy and cyano. n1 is preferably 2, 3, 4, 5, 6, 7, 8, 9 or 10.

More preferably, the organic fluorescent dye having a structural unit of formula (I) is selected from compounds of formulae (I-2), (I-3), (I-4), (I-5), (I-6), (I-7), (I-8), (I-9), (I-10), (I-11), (I-12), (I-13), (I-14), (I-15), (I-16), (I-17), (I-18), (I-19), (I-20), (I-21), (I-22), (I-23), (I-24), (I-25), (I-26), (I-27), (I-28), (I-29), (I-30), (I-31), (I-32), (I-33), (I-34), (I-35), (I-36), (I-37), (I-38), (I-39), (I-40), (I-41), (I-42), (I-43), (I-44), (I-45), (I-46), (I-47), (I-48), (I-49), (I-50), (I-51), (I-52), (I-53), (I-54), (I-55), or mixtures thereof

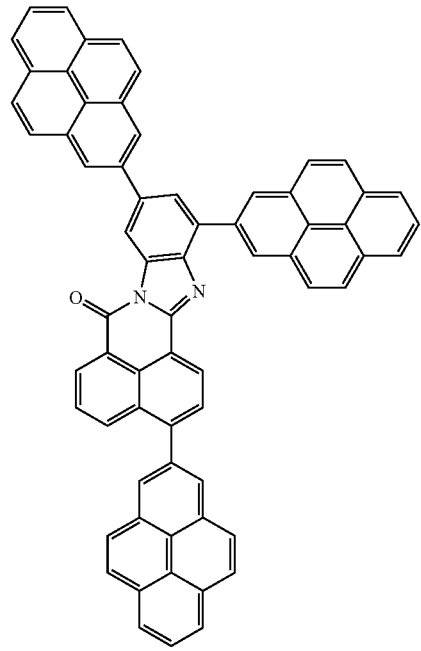

(I-2)

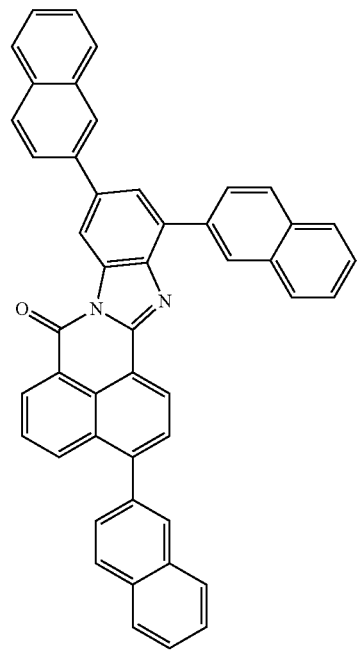

(I-3)

(I-4)
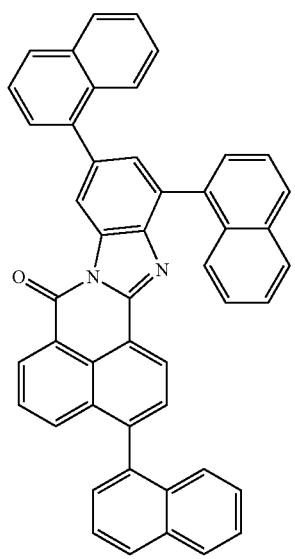
(I-5)
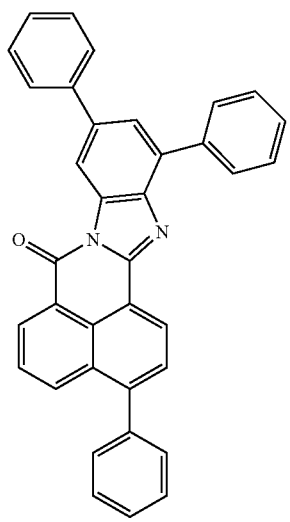
(I-6)
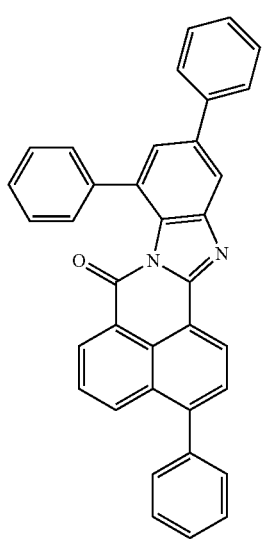
(I-7)
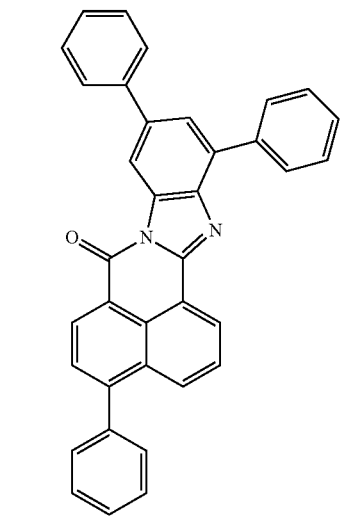
(I-8)
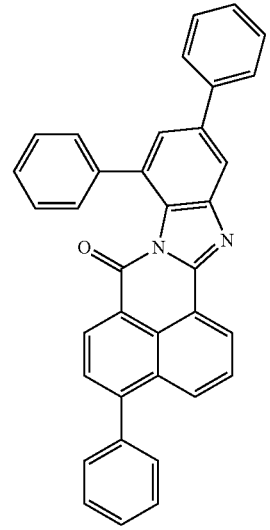
(I-9)
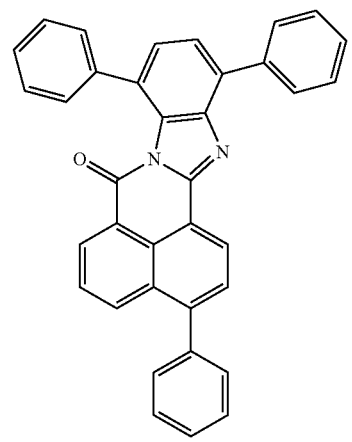

(I-10)
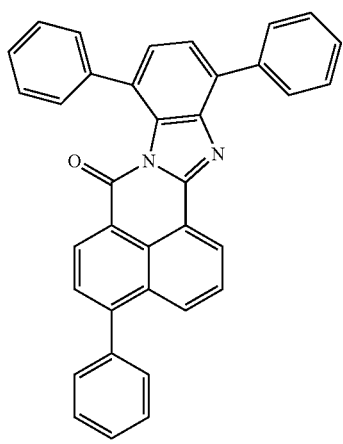
(I-13)
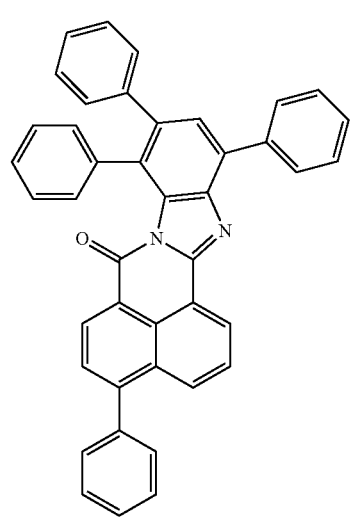
(I-11)
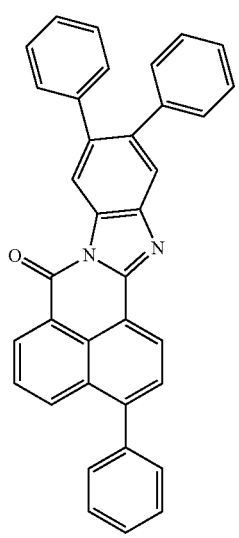
(I-14)
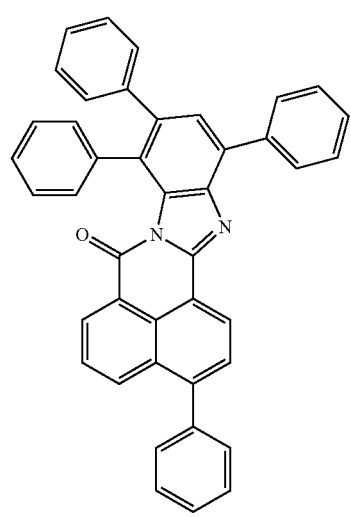
(I-12)
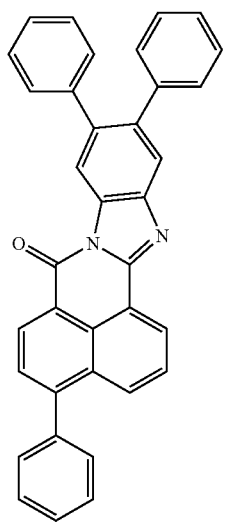
(I-15)
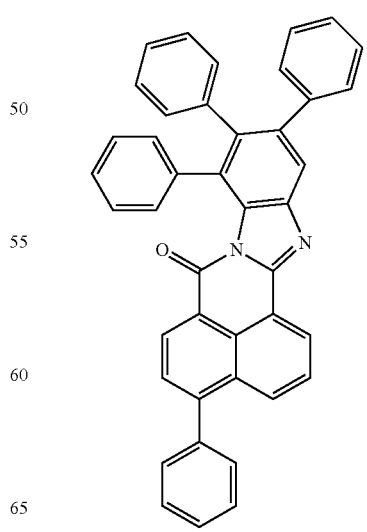

(I-16)
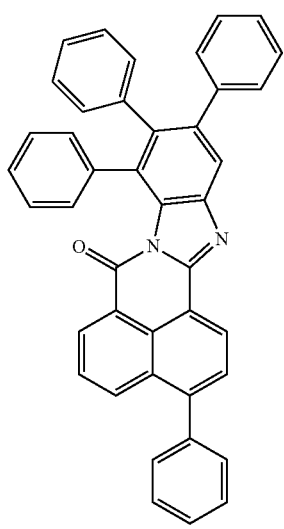
(I-17)
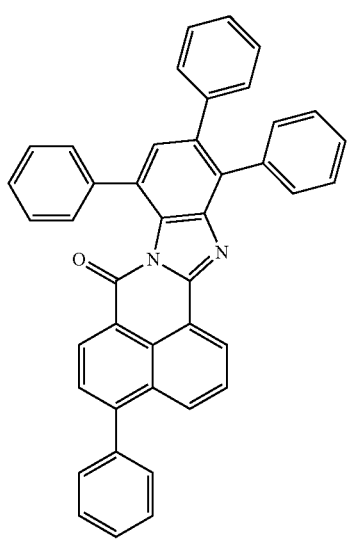
(I-18)
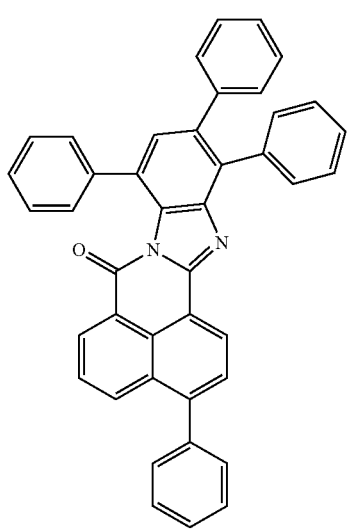
(I-19)
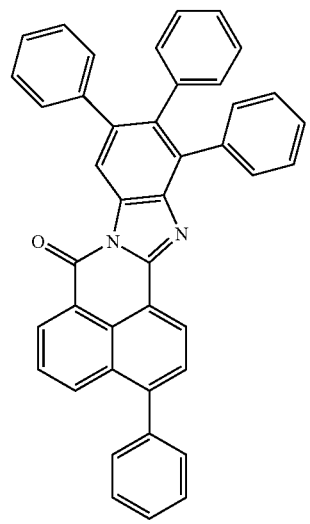
(I-20)
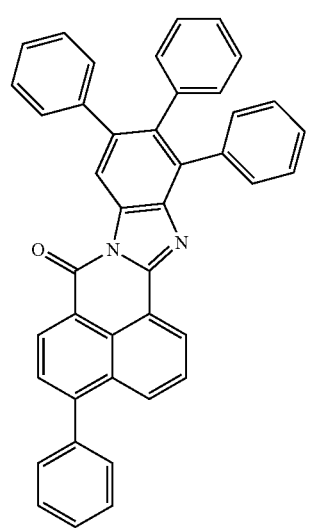
(I-21)
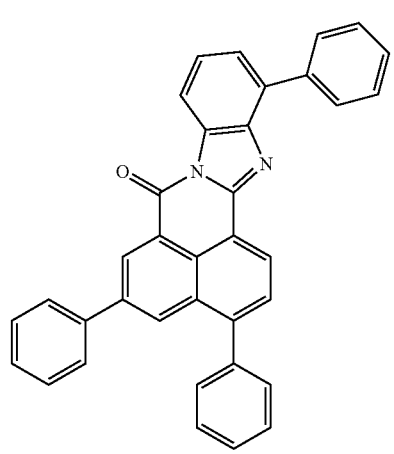

(I-22)
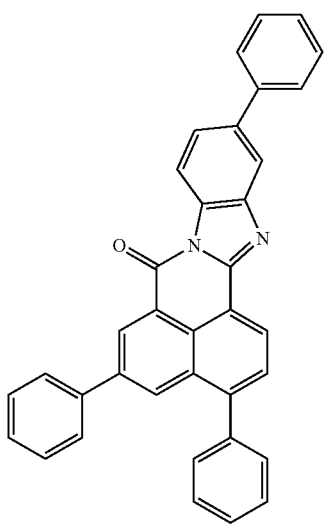
(I-23)
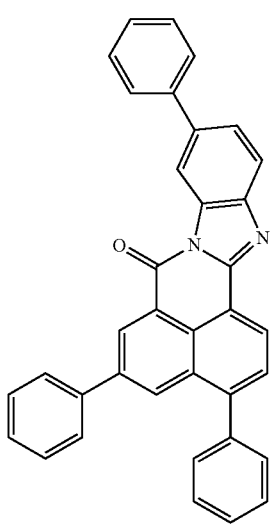
(I-24)
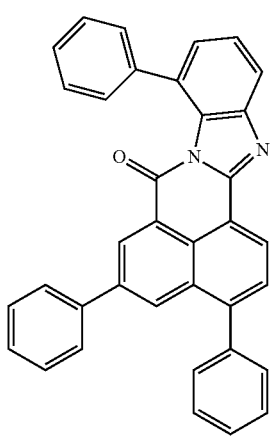
(I-25)
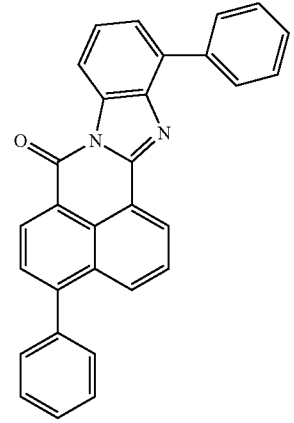
(I-26)
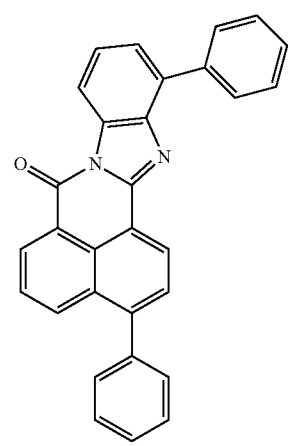
(I-27)
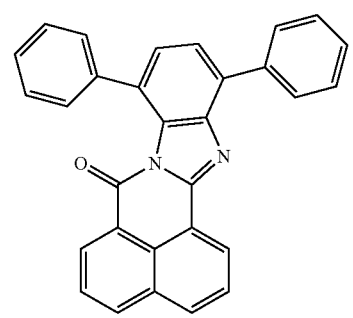
(I-28)
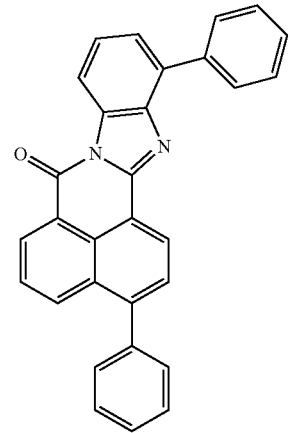

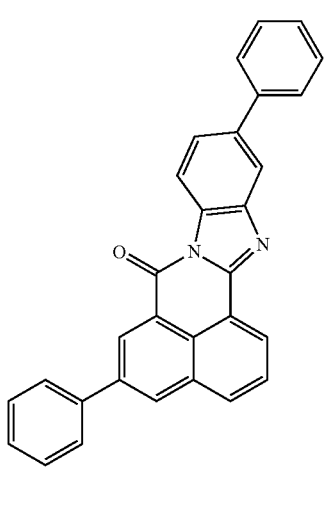
(I-29)
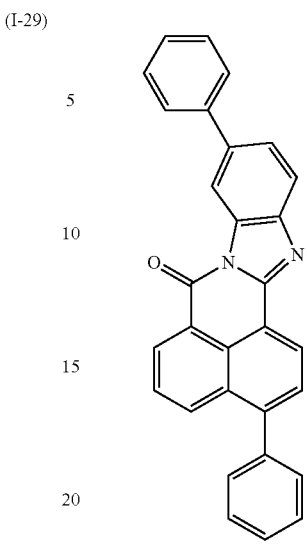
(I-32)
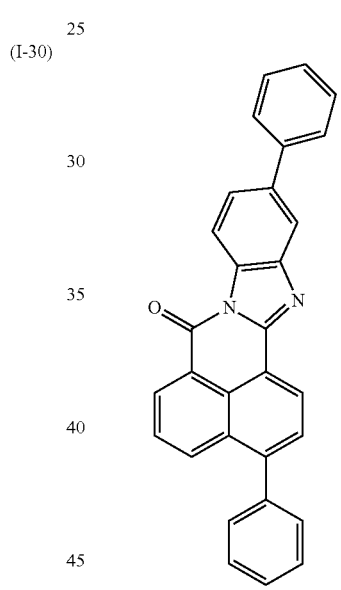
(I-33)
(I-30)
(I-31)
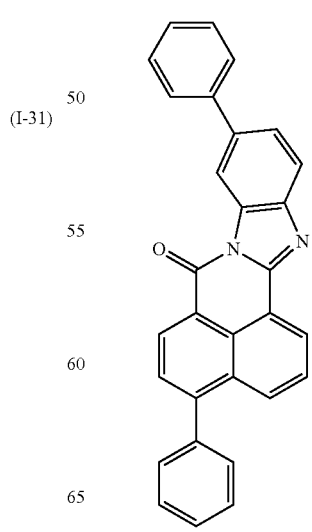
(I-34)

(I-35)
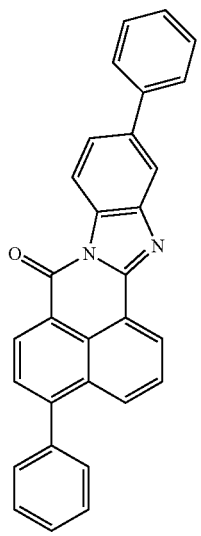
(I-36)
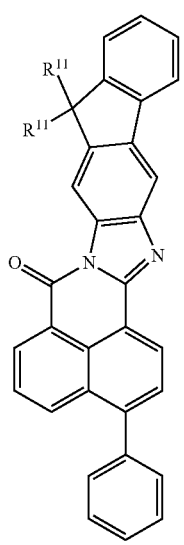
(I-37)
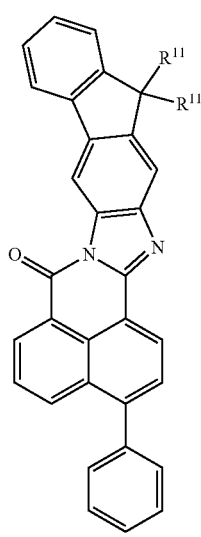
(I-38)
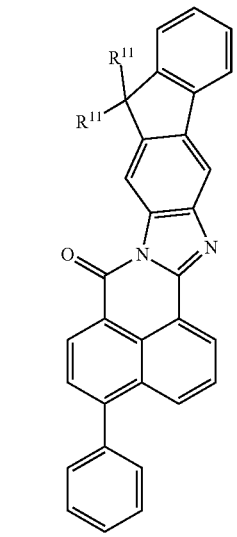
(I-39)
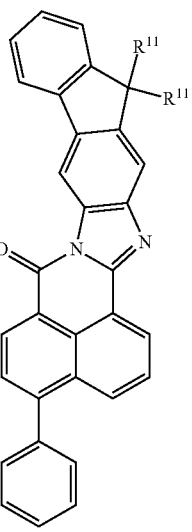
(I-40)
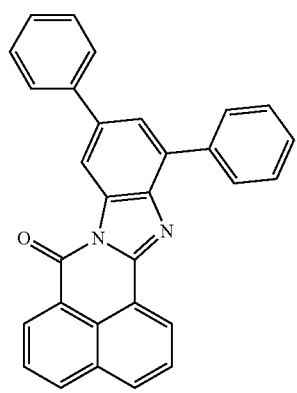

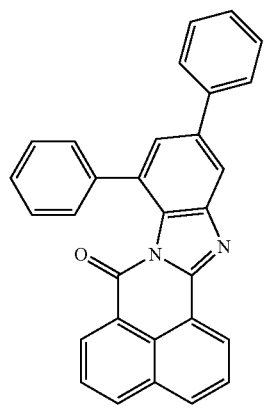 (I-41)
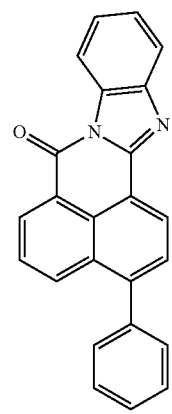 (I-42)
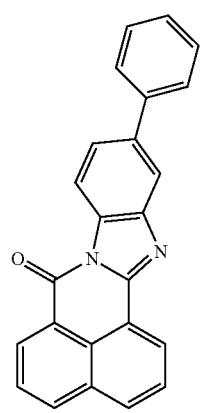 (I-43)
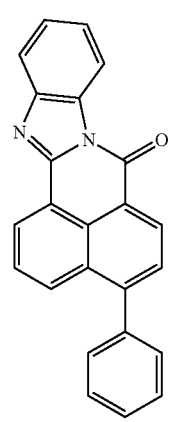 (I-44)
(I-45)
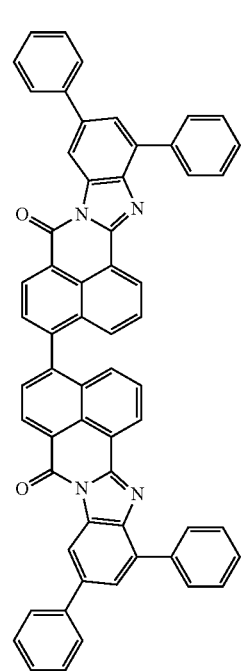 (I-46)

(I-47)
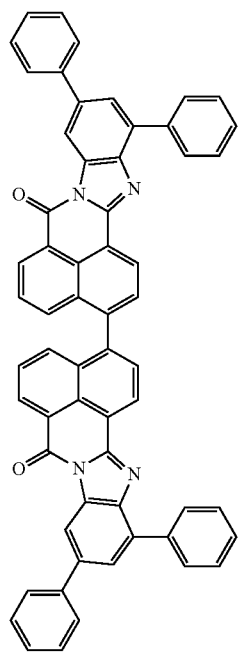
(I-48)
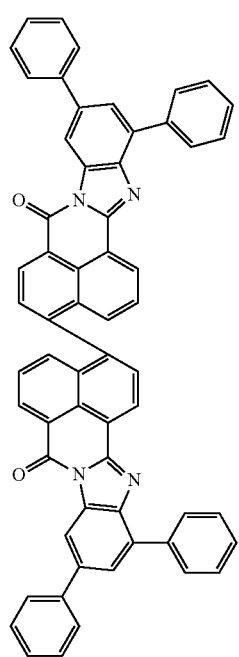
(I-49)
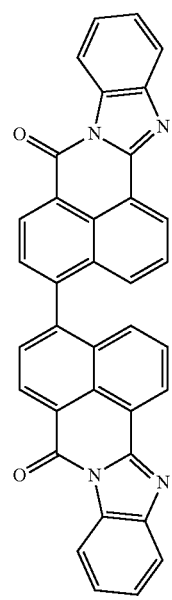
(I-50)
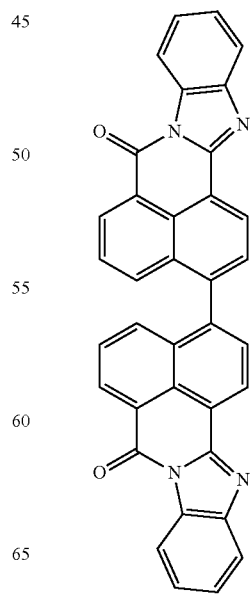

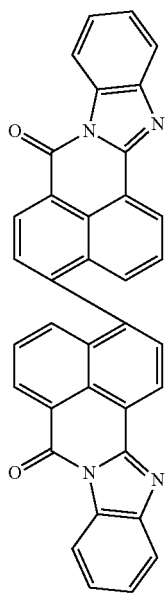

(I-51)

(I-52)

(I-53)

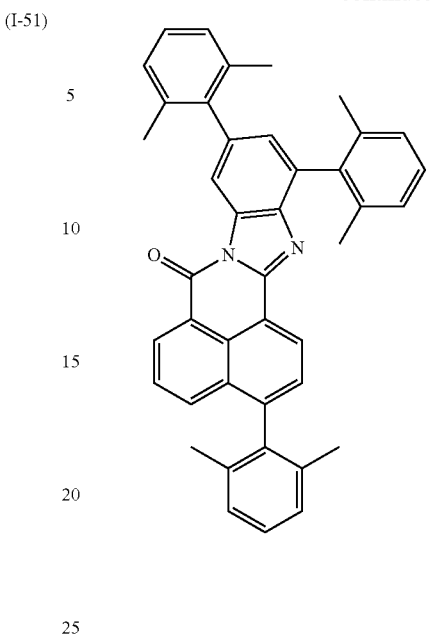

(I-54)

(I-55)

and mixtures thereof, where n1 is a number from 0, 1, 2, 3, 4, 5, 6, 7, 8, 9 or 10;

$R^{11}$ is independently hydrogen, $C_1$-$C_{13}$-alkyl or cycloalkyl, the carbon chain of which may comprise one or more —O—, —S—, —CO—, —SO— and/or —SO$_2$— moieties and which may be mono- or polysubstituted;

aryl or heteroaryl which may be mono- or polysubstituted.

Especially preferred are the compounds of formulae (I-5), (I-6), (I-7) and (I-8) and mixtures thereof. In particular preferred are the compounds of formulae (I-5) and (I-7), and especially the compound of formula (I-5).

(I-5)

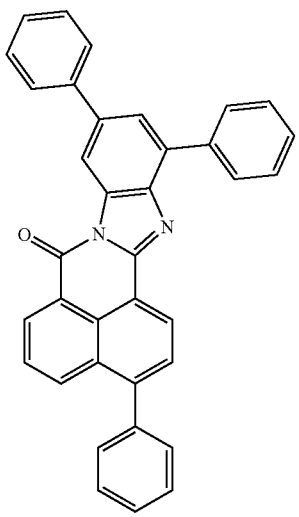

The organic fluorescent dye having a structural unit of formula I re-emits light at wavelengths longer than those of the blue LED and thus the luminous efficiency and the wall-plug efficiency of the yellow light emitting device is increased compared to prior art yellow lighting devices. The conversion of light having wavelengths shorter than 520 nm to light of longer wavelengths leads to increased luminous efficiency and wall plug efficiency compared to prior art yellow lighting devices which merely cut off wavelengths below 520 nm.

Organic Fluorescent Dye (A)

In a further embodiment of the first aspect of the invention, the color converter preferably comprises at least one further organic fluorescent dye (A) selected from the group consisting of (a) a perylene-3,4,9,10-tetracarboxylic acid diimide compound of formula (II)

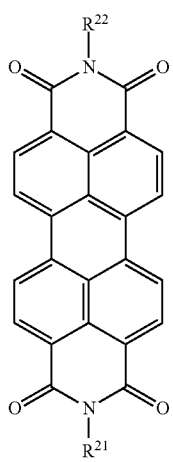

(II)

in which $R^{21}$, $R^{22}$ are each independently $C_1$-$C_{30}$-alkyl, $C_3$-$C_8$-cycloalkyl, $C_6$-$C_{14}$-aryl, hetaryl, or $C_6$-$C_{14}$-aryl-$C_1$-$C_{10}$-alkylene, where the (het)aromatic ring in the three latter radicals is unsubstituted or mono- or polysubstituted by $C_1$-$C_{10}$-alkyl;

(b) an aryloxy-substituted perylene-3,4,9,10-tetracarboxylic acid diimide compound of formula (III)

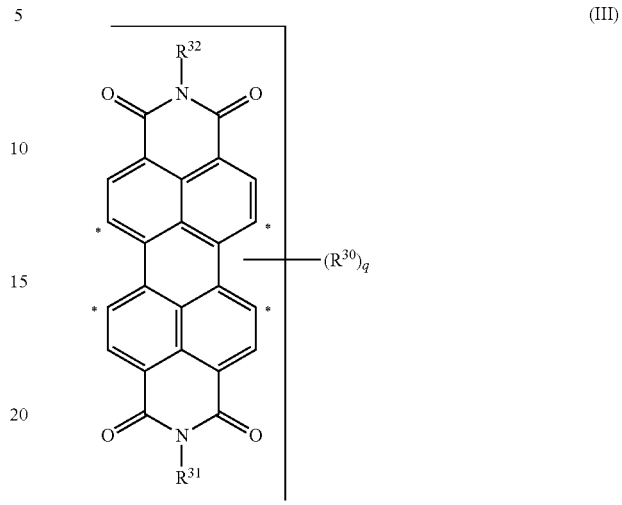

(III)

where q is 1 to 4, $R^{30}$ is aryloxy which is unsubstituted or mono- or polysubstituted by halogen, $C_1$-$C_{10}$-alkyl or $C_6$-$C_{10}$-aryl, where the $R^{30}$ radicals are at one or more of the positions indicated by *;

$R^{31}$, $R^{32}$ are each independently $C_1$-$C_{30}$-alkyl, $C_3$-$C_8$-cycloalkyl, $C_6$-$C_{14}$-aryl, hetaryl, or $C_6$-$C_{14}$-aryl-$C_1$-$C_{10}$-alkylene, where the (het)aromatic ring in the three latter radicals is unsubstituted or mono- or polysubstituted by $C_1$-$C_{10}$-alkyl;

and mixtures thereof;

(c) a core-cyanated naphthoylbenzimidazole compound of formula (IV)

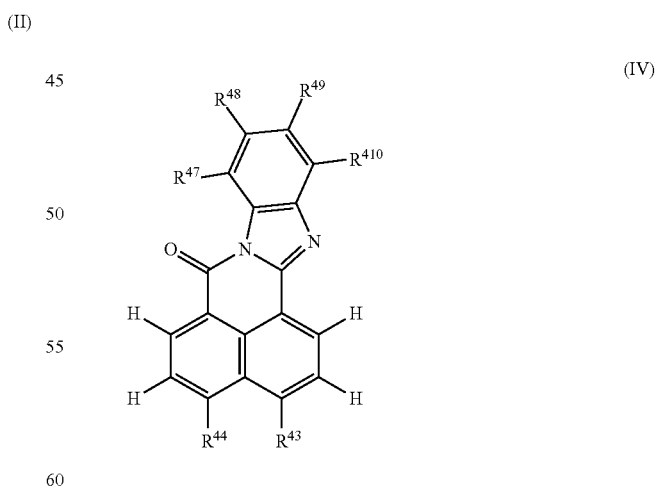

(IV)

wherein one of $R^{43}$ or $R^{44}$ independently of each other is cyano and the other radical $R^{43}$ or $R^{44}$ is selected from the group consisting of cyano, phenyl, 4-cyanophenyl and phenyl which carries 1, 2 or 3 substituents selected from the group consisting of $C_1$-$C_{10}$-alkyl;

$R^{47}$, $R^{48}$, $R^{49}$ and $R^{410}$ independently of each other are hydrogen, cyano, phenyl, 4-cyanophenyl or phenyl which carries 1, 2 or 3 substituents selected from the group consisting of $C_1$-$C_{10}$-alkyl;

and mixtures thereof and (d) a perylene-3,4,9,10-tetracarboxylic acid diimide compound with rigid 2,2'-biphenoxy bridges of formula (V)

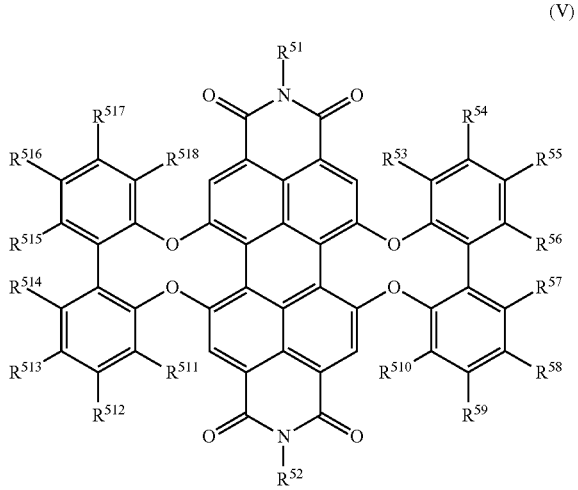

(V)

wherein $R^{51}$ and $R^{52}$, independently of each other, are selected from the group consisting of hydrogen,
  in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy;

$R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$ and $R^{518}$ independently of each other, are selected from the group consisting of hydrogen, halogen, cyano, hydroxyl, mercapto, tro, —$NE^{51}E^{52}$, —$NR^{Ar51}COR^{A52}$, —$CONR^{Ar51}R^{Ar52}$, —$SO_2NR^{A51}R^{A52}$, —$COOR^{Ar51}$, —$SO_3R^{Ar52}$,
  in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio,
  where $R^{53}$ and $R^{54}$, $R^{54}$ and $R^{55}$, $R^{55}$ and $R^{56}$, $R^{56}$ and $R^{57}$, $R^{57}$ and $R^{58}$, $R^{58}$ and $R^{59}$, $R^{59}$ and $R^{510}$, $R^{511}$ and $R^{512}$, $R^{512}$ and $R^{513}$, $R^{513}$ and $R^{514}$, $R^{55}$ and $R^{515}$, $R^{515}$ and $R^{516}$, $R^{516}$ and $R^{517}$ and/or $R^{517}$ and $R^{518}$ together with the carbon atoms of the biphenylyl moiety to which they are bonded, may also form a further fused aromatic or non-aromatic ring system wherein the fused ring system is unsubstituted or substituted;

where $E^{51}$ and $E^{52}$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; $R^{Ar51}$ and $R^{Ar52}$, each independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl;

and mixtures thereof, and mixtures thereof.

The at least one further organic fluorescent dye (A) is capable of absorbing light emitted from the light source and/or capable of absorbing light emitted from the organic fluorescent dye having a structural unit of formula I. The at least one further organic fluorescent dye (A) preferably emits at a wavelength range of from 520 to 750 nm, more preferably 520 to 700 nm, even more preferably 520 to 630 nm. These values refer to the wavelength with the maximum emission coefficient in the emission spectrum.

Compound of Formula

Compounds of formula are well known in the art, e.g. from U.S. Pat. No. 4,379,934 or 4,446,324. They can be prepared by conventional processes, for example by condensing perylene-3,4,9,10-tetracarboxylic acid or its dianhydride with amines.

Preferably, in compounds of the formula II, $R^{21}$ and $R^{22}$ are linear $C_1$-$C_{18}$ alkyl, branched $C_3$-$C_{18}$ alkyl, $C_4$-$C_8$-cycloalkyl, phenyl or naphthyl which may be mono- or polysubstituted by $C_1$-$C_{10}$ alkyl. Preferably, $R^{21}$ and $R^{22}$ have the same meaning. In one embodiment, $R^{21}$ and $R^{22}$ in formula represent compounds with what is called swallowtail substitution, as specified in WO 2009/037283 A1 at page 16, line 19 to page 25, line 8. In a preferred embodiment, $R^{21}$ and $R^{22}$, independently of each other, are a 1-alkylalkyl, for example 1-ethylpropyl, 1-propylbutyl, 1-butylpentyl, 1-pentylhexyl or 1-hexylheptyl. More preferably, $R^{21}$ and $R^{22}$ are $C_1$-$C_{18}$-alkyl, phenyl or naphthyl, wherein the aromatic ring of the two last-mentioned radicals is unsubstituted or substituted by 1, 2 or 3 $C_1$-$C_4$-alkyl radicals. Even more preferably, $R^{21}$ and $R^{22}$ in the formula II is 2,4-di(tert-butyl)phenyl, 2,4-di(isopropyl)phenyl, 2,6-di(tert-butyl)phenyl, 2,6-di(isopropyl)phenyl, in particular 2,6-diisopropylphenyl.

A preferred compound of formula II is N,N'-bis(2,6-diisopropylphenyl)-3,4,9,10-perylenetetracarboxylic diimide (CAS-number: 82953-57-9).

Compound of Formula III

Aryloxy-substituted perylene imide compounds of formula III are known in the art, Suitable examples of compounds of formula III are for example the perylene derivatives specified in WO 2007/006717, especially at page 1, line 5 to page 22, line 6; in U.S. Pat. No. 4,845,223, especially col. 2, line 54 to col. 6, line 54; in WO 2014/122549, especially at page 3, line 20 to page 9, line 11; in EP 3072887 and in WO2018/065502, especially at page 36, line 13 to page 38, line 16; in WO2018/134263, especially at page 22, line 12 to page 24, line 3. The compounds of formula III are usually red fluorescent dyes. Preferred are compounds of formula III, wherein $R^{31}$ and $R^{32}$ are each independently selected from $C_1$-$C_{10}$-alkyl, 2,6-di($C_1$-$C_{10}$-alkyl)phenyl, and 2,4-di($C_1$-$C_{10}$alkyl)phenyl. More preferably, $R^{31}$ and $R^{32}$ are identical. Especially preferably, $R^{31}$ and $R^{32}$ are each 2,6-diisopropylphenyl or 2,4-di-tert-butylphenyl. $R^{30}$ is preferably phenoxy, which is unsubstituted or substituted by 1 or 2 identical or different substituents selected from fluorine, chlorine, $C_1$-$C_{10}$-alkyl or phenyl. Preferably, q is 2, 3 or 4, in particular 2 or 4.

The compounds of formula III can be prepared in analogy to the methods described for example in WO 2007/006717, U.S. Pat. No. 4,845,223, and WO 2014/122549.

Suitable organic fluorescent dyes of formula III are, for example, N,N'-bis(2,6-diisopropylphenyl)-1,6-di(2,6-diisopropylphenoxy)perylene-3,4:9,10-tetracarboximide, N,N'-bis(2,6-diisopropylphenyl)-1,7-di(2,6-diisopropylphenoxy)perylene-3,4:9,10-tetracarboximide, N,N'-bis(2,6-diisopropylphenyl)-1,6-di(p-tert-octylphenoxy)perylene-3,4;9,10-tetracarboximide, N,N'-bis(2,6-diisopropylphenyl)-1,7-di(p-tertoctylphenoxy)perylene-3,4;9,10-tetracarboximide, N,N'-bis(2,6-diisopropyl¬phenyl)-1,6-diphenoxyperylene-3,4;9,10-tetracarboximide, N,N'-bis(2,6-diisopropyl¬phenyl)-1,7-diphenoxyperylene-3,4;9,10-tetracarboximide, N,N'-bis(2,6-diisopropyl¬phenyl)-1,6-di(2,6-diphenylphenoxy)perylene-3,4;9,10-tetracarboximide, N,N' bis(2,6-diisopropyl¬phenyl)-1,7-di(2,6-diphenylphenoxy)perylene-3,4;9,10-tetracarboximide, N,N'-bis(2,6-diisopropylphenyl)-1,7-di(2,3-difluorophenoxy)perylene-3,4:9,10-tetracarboximide, N,N'-bis(2,6-diisopropylphenyl)-1,6,7,12-tetraphenoxyperylene-3,4:9,10-tetracarboximide, N,N'-bis(2,6-diisopropylphenyl)-1,6,7,12-tetra(2-phenylphenoxy)perylene-3,4:9,10-tetracarboximide, N,N'-bis(2,6-diisopropyl¬phenyl)-1,6,7,12-tetra(2-isopropylphenoxy)perylene-3,4:9,10-tetracarboximide, N,N'-bis(2,6-diisopropylphenyl)-1,6,7,12-tetra(2-phenylphenoxy)perylene-3,4:9,10-tetracarboximide, N,N'-bis(2,6-diisopropylphenyl)-1,6,7,12-tetra(2,4-diphenylphenoxy)perylene-3,4:9,10-tetracarboximide; N,N'-bis(2,6-diisopropylphenyl)-1,6,7,12-tetra(3-fluorophenoxy)perylene-3,4:9,10-tetracarboximide, N,N'-bis(2,6-diisopropylphenyl)-1,6,7,12-tetra(3-chlorophenoxy)perylene-3,4:9,10-tetracarboximide, N,N'-bis(2,6-diisopropylphenyl)-1,6,7,12-tetra(2,3-difluorophenoxy)perylene-3,4:9,10-tetracarboximide, N,N'-bis(2,6-diisopropylphenyl)-1,6,7,12-tetra(2,5-difluorophenoxy)perylene-3,4:9,10-tetracarboximide, N,N'-bis(2,6-diisopropylphenyl)-1,6,7,12-tetra(2,6-difluorophenoxy)perylene-3,4:9,10-tetracarboximide, N,N'-bis(2,6-diisopropylphenyl)-1,6,7,12-tetra(2,3-dichlorophenoxy)perylene-3,4:9,10-tetracarboximide, N,N'-bis(2,6-diisopropylphenyl)-1,6,7,12-tetra(2,6-dichlorophenoxy)perylene-3,4:9,10-tetracarboximide, N,N'-bis(2,6-diisopropylphenyl)-1,6,7,12-tetra(2,5-dichlorophenoxy)perylene-3,4:9,10-tetracarboximide.

In particular, the compound of formula III is selected from compounds III-1, III-2, III-3, III-4, III-5 or III-6 and mixtures thereof

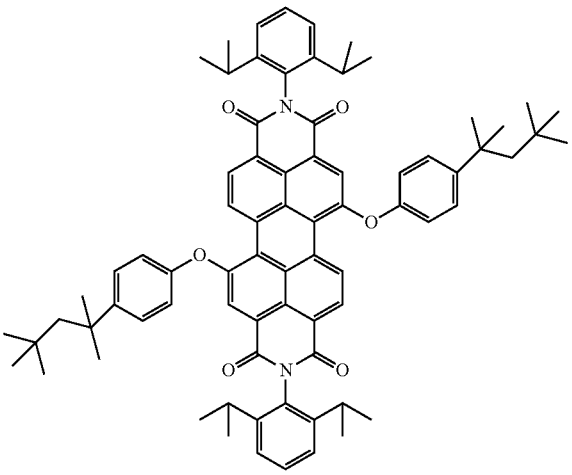

(III-1)

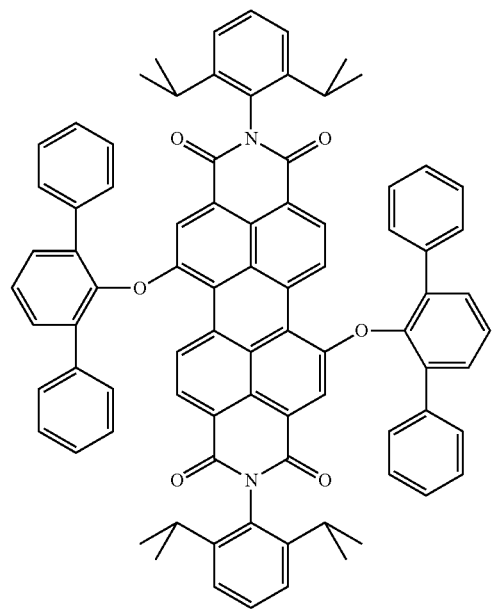

(III-2)

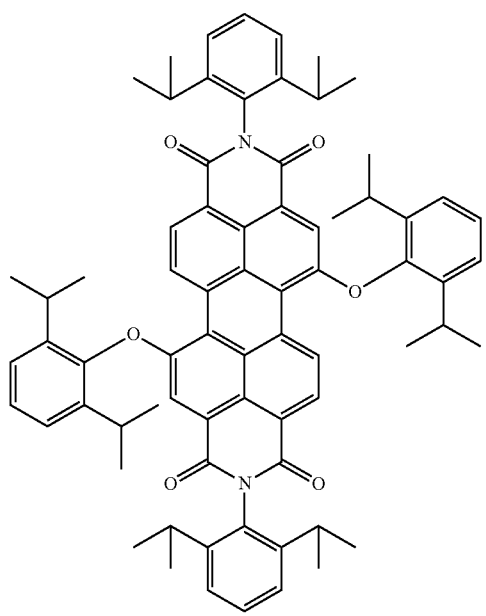
(III-3)
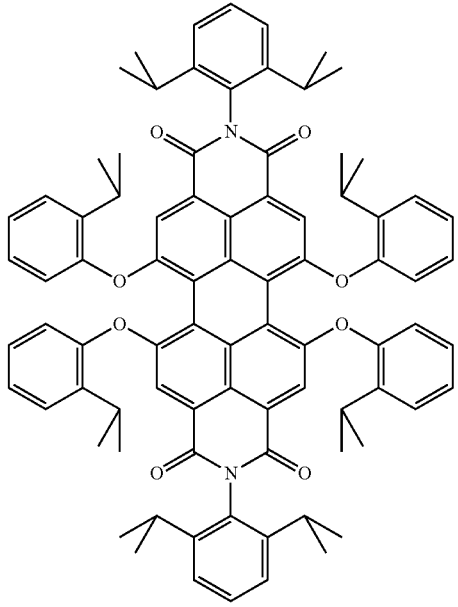
(III-5)
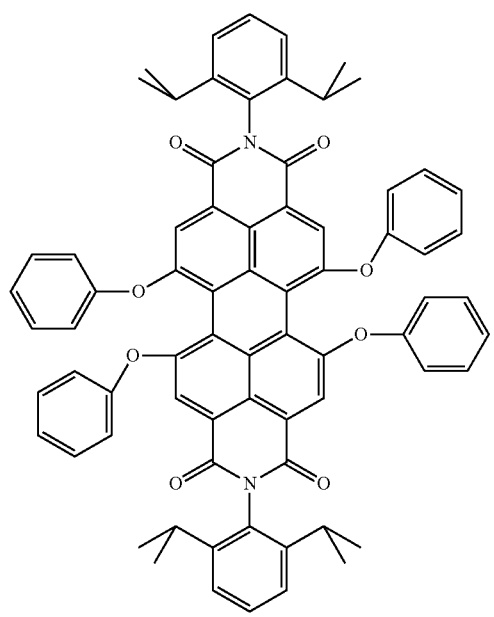
(III-4)
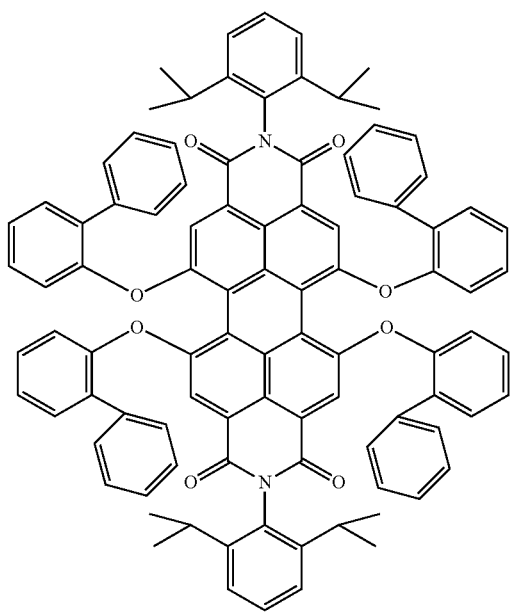
(III-6)
In particular preferred is the compound of formula III-4, namely N,N'-bis(2,6-diisopropylphenyl)-1,6,7,12-tetraphenoxyperylene-3,4:9,10-tetracarboximide.
Compound of Formula IV
Core-cyanated naphthoylbenzimidazole compounds of formula IV are known from WO 2015/019270. Examples of compounds of formula IV are the compounds (IV-1)
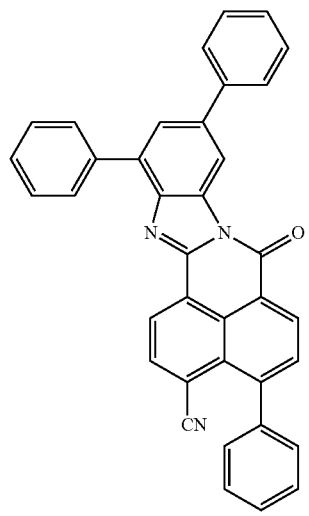
(IV-2)
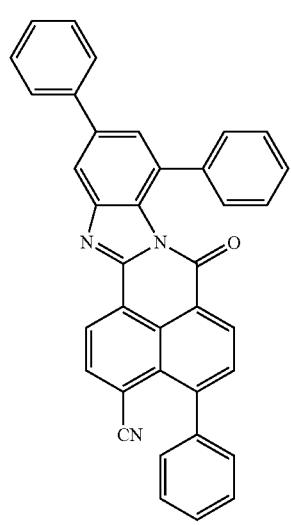
(IV-3)
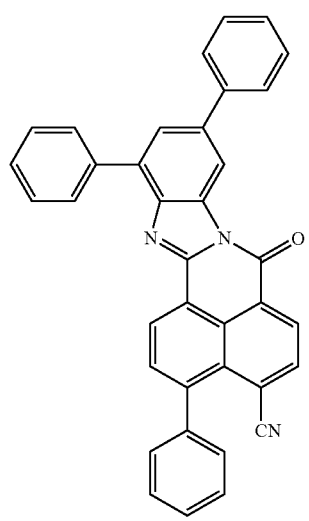
(IV-4)
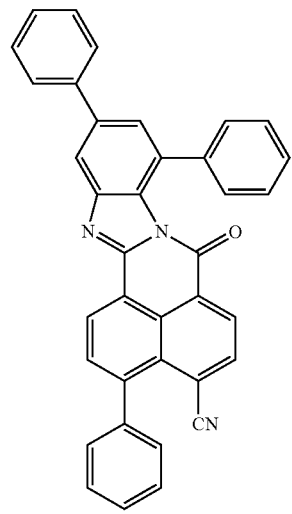
(IV-5)
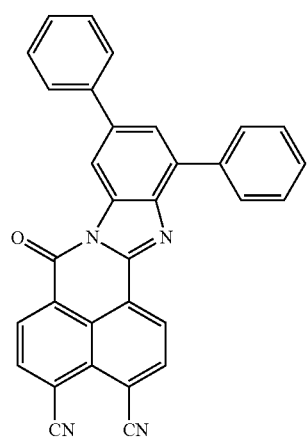
(IV-6)
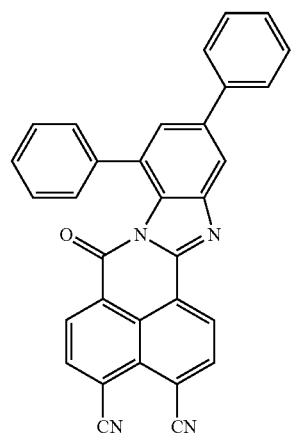

(IV-7)
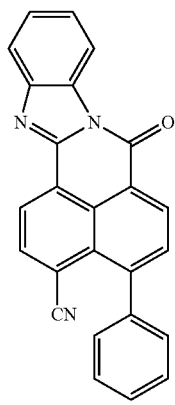
(IV-8)
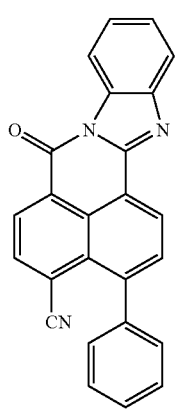
(IV-9)
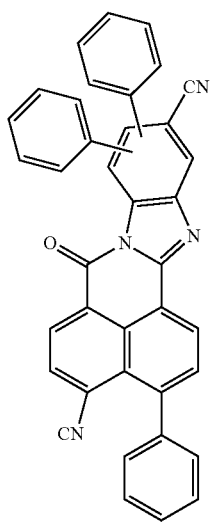
(IV-10)
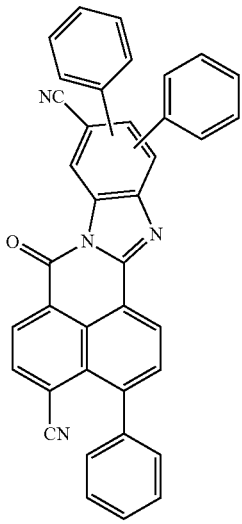
(IV-11)
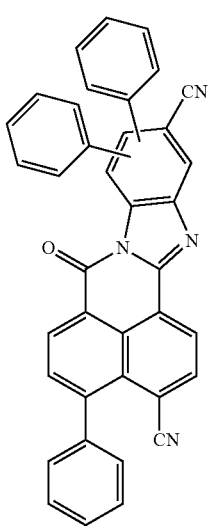
(IV-12)
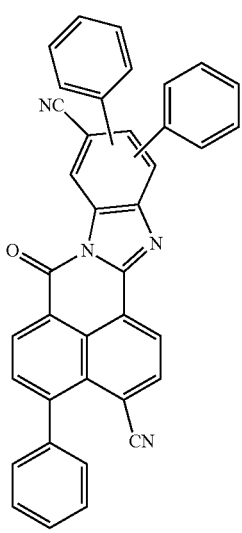

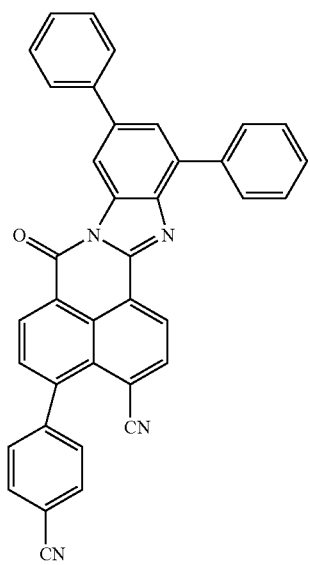
(IV-13)
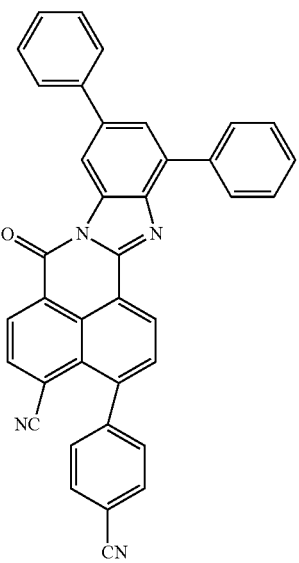
(IV-15)
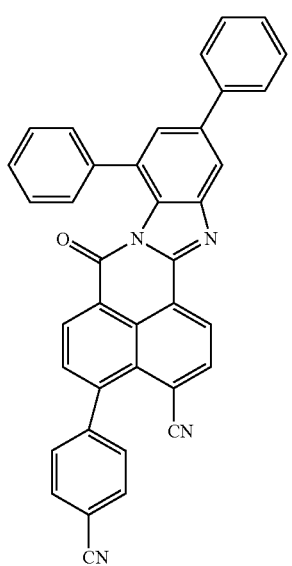
(IV-14)
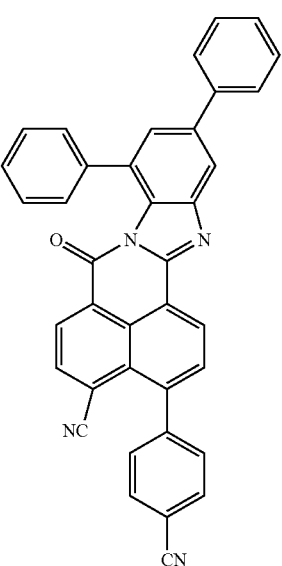
(IV-16)

(IV-17)
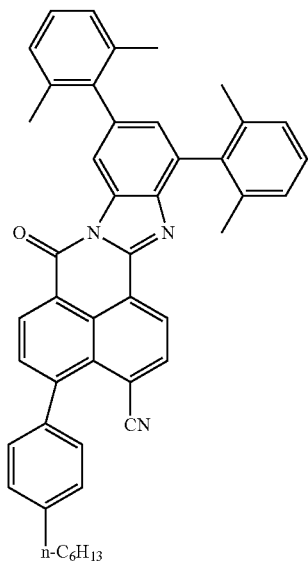
(IV-18)
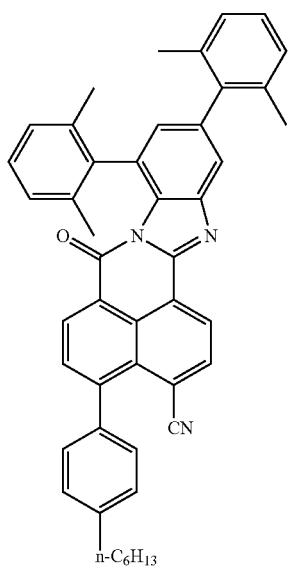
(IV-19)
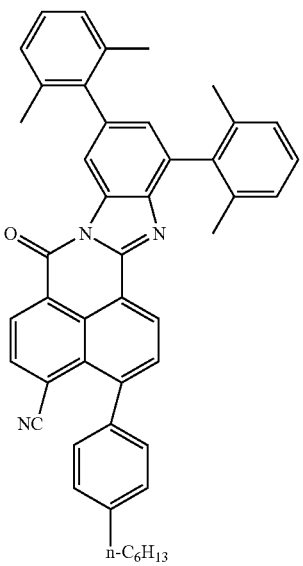
(IV-20)
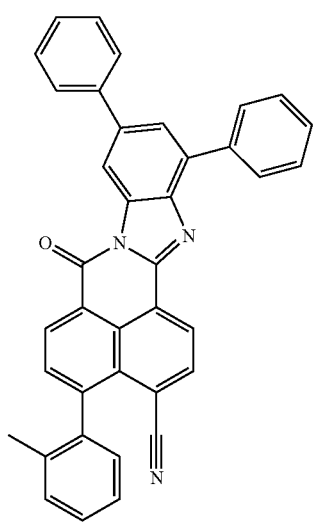
(IV-21)

(IV-22)
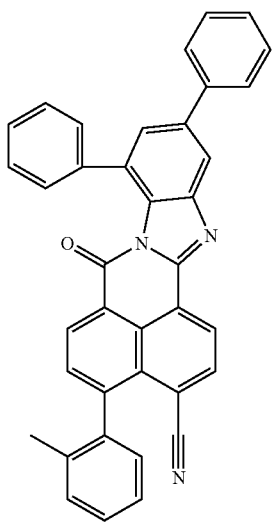
(IV-23)
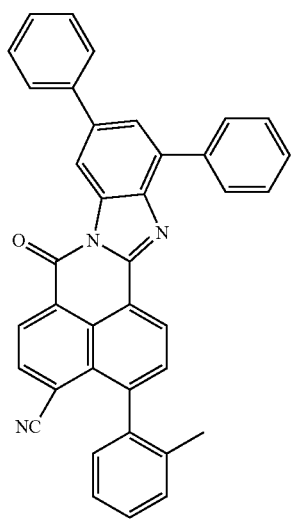
(IV-24)
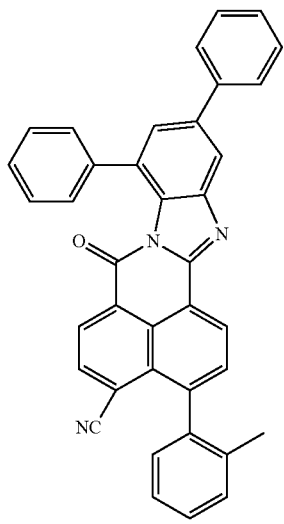
(IV-25)
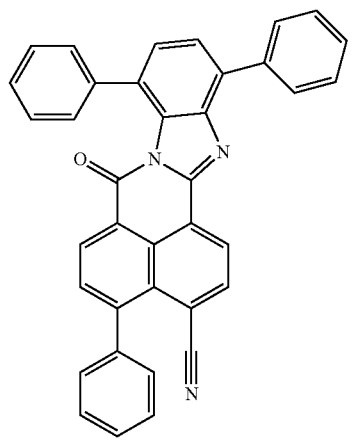
(IV-26)
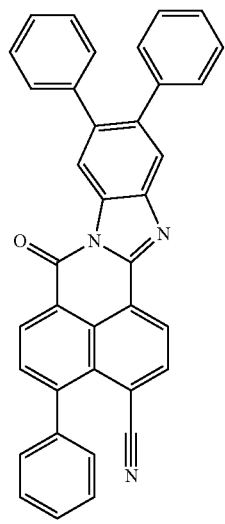
(IV-27)
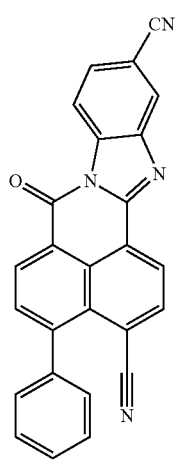

-continued

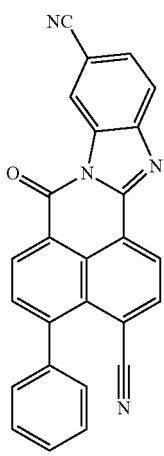
(IV-28)

(IV-29)

(IV-30)

Especially suitable compounds of formula IV are those, wherein one of $R^{43}$ or $R^{44}$ is cyano and the other radical $R^{43}$ or $R^{44}$ is phenyl, 4-cyanophenyl and phenyl which carries 1, 2 or 3 substituents selected from the group consisting of $C_1$-$C_{10}$-alkyl. Likewise, especially suitable compounds of formula IV are those, where two of the radicals $R^{47}$, $R^{48}$, $R^{49}$, and $R^{410}$ are phenyl and the other two radicals $R^{47}$, $R^{48}$, $R^{49}$ and $R^{410}$ are hydrogen. Among these, more preferred are the compounds IV-1, IV-2, IV-3, IV-4 and mixtures thereof, especially the compound IV-1. Likewise more preferred are the compounds IV-13, IV-14, IV-15, IV-16 and mixtures thereof, especially the compound IV-13.

Compound of Formula V

Compounds of formula V are subject matter of WO 2017/121833. Preference is given to compounds of formula V, where $R^{51}$ and $R^{52}$ are, independently of each other, selected from the group consisting of phenyl which is unsubstituted or substituted by 1, 2 or 3 $C_1$-$C_6$-alkyl; and $R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$ and $R^{518}$ are each hydrogen. The compound of formula V as defined above is preferably the compound of formula V.1

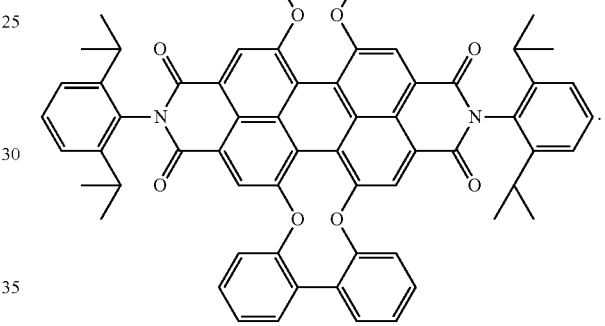
(V.1)

Preferably, the color converter comprises at least one further organic fluorescent dye (A), especially a fluorescent dye emitting at a wavelength of 520 to 630 nm to increase luminous efficiency and/or the wall plug efficiency of the yellow light emitting device and decreases emission below 520 nm.

Preferably, the at least one further organic fluorescent dye (A) is selected from a compound of formula II, a compound of formula III and mixtures thereof.

Thus, according to a preferred embodiment of the first aspect of the invention, the color converter comprises besides at least one organic fluorescent dye comprising at least one structural unit of formula I also at least one compound of the formula II.

According to this preferred embodiment of the first aspect of the invention, the color converter more preferably comprises the compound of formula I-5 and N,N'-bis(2,6-diisopropylphenyl)-3,4,9,10-perylenetetracarboxylic diimide (compound of formula II).

According to another preferred embodiment of the first aspect of the invention, the color converter comprises the compound of formula I-7 and N,N'-bis(2,6-diisopropylphenyl)-3,4,9,10-perylenetetracarboxylic diimide (compound of formula II).

According to another preferred embodiment of the first aspect of the invention, the color converter comprises the compound of the formula I-5, the compound of formula I-7 and N,N'-bis(2,6-diisopropylphenyl)-3,4,9,10-perylenetetracarboxylic diimide (compound of formula II).

According to a further preferred embodiment of the first aspect of the invention, the color converter comprises besides at least one organic fluorescent dye comprising at least one structural unit of formula I at least one compound of the formula and at least one compound of the formula III.

According to this preferred embodiment of the first aspect of the invention, the color converter more preferably comprises the compound of formula I-5, N,N'-bis(2,6-diisopropylphenyl)-3,4,9,10-perylenetetracarboxylic diimide and a compound of formula III selected from the group consisting of compounds III-1, III-2, III-3, III-4, III-5, III-6 and mixtures thereof, in particular the compound of formula III-4.

According to this preferred embodiment of the first aspect of the invention, the color converter more preferably comprises the compound of formula I-7, N,N'-bis(2,6-diisopropylphenyl)-3,4,9,10-perylenetetracarboxylic diimide and a compound of formula III selected from the group consisting of compounds III-1, III-2, III-3, III-4, III-5, III-6 and mixtures thereof, in particular the compound of formula III-4.

According to this preferred embodiment of the first aspect of the invention, the color converter more preferably comprises the compound of formula I-5, the compound of formula I-7, N,N'-bis(2,6-diisopropylphenyl)-3,4,9,10-perylenetetracarboxylic diimide and a compound of formula III selected from the group consisting of compounds III-1, III-2, III-3, III-4, III-5, III-6 and mixtures thereof, in particular the compound of formula III-4.

In a specific embodiment of the first aspect of the invention, the at least one further organic fluorescent dye(s) selected from the compounds of formula II, formula III, formula IV and formula V as defined above is (are) embedded in the polymer matrix.

When the color converter comprises more than one fluorescent dye, it is possible in one embodiment of the invention for several fluorescent dyes to be present alongside one another in one layer. In another embodiment, the color converter has a multilayer structure, generally composed of a plurality of polymer layers comprising one or more fluorescent dyes.

Other Additives

According to a further preferred embodiment of the first aspect of the invention, the color converter comprises a scattering agent (scattering body or simply scatterer).

Suitable light scattering agents are inorganic white pigments, for example titanium dioxide, barium sulfate, lithopone, zinc oxide, zinc sulfide, calcium carbonate with a mean particle size to DIN 13320 of 0.01 to 10 µm, preferably 0.1 to 1 µm, more preferably 0.15 to 0.4 µm. These scattering agents are included typically in an amount of 0.01 to 2.0% by weight, preferably 0.05 to 0.5% by weight, more preferably 0.1 to 0.4% by weight, based in each case on the polymer of the layer comprising scattering bodies.

Examples of suitable light scattering organic agents include those based on poly(acrylates); poly(alkyl methacrylates), for example poly(methyl methacrylate) (PMMA); poly(tetrafluoroethylene) (PTFE); silicone-based scattering agents, for example hydrolyzed poly(alkyl trialkoxysilanes), modified silicone dioxide beads such as poly(alkylsilsesquioxanes), especially poly(methyl silsesquioxane), and mixtures thereof. The size of these light scattering agents (average diameter-weight average) is usually in the range from 0.5 to 50 µm, preferably 1 to 10 µm. These scattering agents are typically included in an amount of 1 to 10 weight parts per 100 weight parts of the polymer. Useful scattering agents are for example a mixture of 3-5% by weight of PMMA based scattering agent and 1.5 to 2% by weight of silicone base scattering agent.

Also suitable are light-scattering compositions which contain polymeric particles based on vinyl acrylate with a core/shell morphology in combination with $TiO_2$ as described in EP-A 634 445.

Preferably, the at least one scattering agent is a poly (methyl methacrylate)-based scattering agent, silicone-based scattering agent or $TiO_2$. Likewise preferably, the scattering agent is poly(methyl silsesquioxane).

Further, the color converter may comprise an inorganic luminescent material or a plurality of inorganic luminescent materials. The inorganic luminescent material is preferably selected from quantum dots, garnets, silicates, sulfides, nitrides and oxynitrides. Suitable examples of garnets, silicates, sulfides, nitrides and oxynitrides are compiled in table I below:

TABLE I

| Class | Compounds | Excitation Peak nm | Emission Peak nm | Reference |
|---|---|---|---|---|
| Garnets | YAG:Ce ($Y_3Al_5O_{12}$:Ce) (Y,Gd,Tb,Lu)$_3Al_5O_{12}$:Ce | 460-470 | 550 | U.S. Pat. No. 5,998,925 |
|  | TAG:Ce ($Tb_3Al_5O_{12}$:Ce) | 460-470 | 575 | U.S. Pat. No. 6,669,866, U.S. Pat. No. 6,812,500, U.S. Pat. No. 6,576,930, US6,0060,861, U.S. Pat. No. 6,245,259, U.S. Pat. No. 6,765,237 |
| Silicates | Eu-doped Silicates $A_2Si(OD)_4$:Eu with A = Sr, Ba, Ca, Mg, Zn and D = F, Cl, S, N, Br (SrBaCa)$_2SiO_4$:Eu $Sr_3SiO_5$ $Ba_2MgSi_2O_7$:$Eu^{2+}$; $Ba_2SiO_4$:$Eu^{2+}$ (Ca,Ce)$_3$(Sc,Mg)$_2Si_3O_{12}$ | <460 | 510 to 610 | U.S. Pat. No. 7,311,858, U.S. Pat. No. 7,267,787 U.S. Pat. No. 6,809,347, U.S. Pat. No. 6,943,380 U.S. Pat. No. 6,429,583 WO 02/11214 |
| Sulfides | (Ca,Sr)S:Eu | <460 | 615-660 |  |
| Nitrides | (CaAlSiN$_3$:$Eu^2$) (Sr,Ca)AlSiN$_3$:$Eu^{2+}$ | 455 | red orange | WO 2005052087 |

TABLE I-continued

| Class | Compounds | Excitation Peak nm | Emission Peak nm | Reference |
|---|---|---|---|---|
| Oxy-nitrides | SiAlON:Ce<br>β-SiAlON:Eu<br>Ca-alpha-SiAlON:Eu<br>(Ba$_3$Si$_6$O$_{12}$N$_2$:Eu)<br>General formula<br>Ca$_x$Eu$_y$(Si,Al)$_{12}$(O,N)$_{16}$ | 300-580 | 490<br>540<br>585-595 | |

Suitable quantum dots are nanocrystals of a semiconductor material having a diameter of about 20 nm or less. The quantum dot may include one of a Si-based nanocrystal, a group II-VI compound semiconductor nanocrystal, a group III-V compound semiconductor nanocrystal, a group IV-VI compound nanocrystal and a mixture thereof. The group II-VI compound semiconductor nanocrystal may include one selected from a group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZn-STe, CdHgSeS, CdHgSeTe, CdHgSTe, HgZnSeS, HgZn-SeTe and HgZnSTe. The group III-V compound semiconductor nanocrystal may include one selected from a group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI compound semiconductor nano crystal may be SnTe.

To synthesize a nanocrystal in form of a quantum dot, quantum dots may be prepared by vapor deposition such as metal organic chemical vapor deposition or molecular beam epitaxy, or by a wet chemical process in which a crystal is grown by adding one or more precursors into an organic solvent.

When the color converter contains inorganic luminescent material, the inorganic luminescent material is the minor component based on the total amount of inorganic luminescent material and organic fluorescent dye(s).

Preferably, the color converter does not include any inorganic luminescent material. Suitable matrix materials may comprise, as further constituents, additives, such as flame retardants, antioxidants, light stabilizers, UV absorbers, free-radical scavengers, antistats. Such stabilizers are known to those skilled in the art.

Suitable antioxidants or free-radical scavengers are, for example, phenols, especially sterically hindered phenols such as butylhydroxyanisole (BHA) or butylhydroxytoluene (BHT), or sterically hindered amines (HALS). Stabilizers of this kind are sold, for example, by BASF under the Irganox® trade name. In some cases, antioxidants and free-radical scavengers can be supplemented by secondary stabilizers such as phosphites or phosphonites, as sold, for example, by BASF under the Irgafos® trade name.

Suitable UV absorbers are, for example, benzotriazoles such as 2-(2-hydroxyphenyl)-2H-benzotriazole (BTZ), triazines such as (2-hydroxyphenyl)-striazine (HPT), hydroxybenzophenones (BP) or oxalanilides. UV absorbers of this kind are sold, for example, by BASF under the Uvinul® trade name.

Preferably, the polymer matrix does not comprise any antioxidants or free-radical scavengers.

In one embodiment, suitable matrix materials have been mechanically reinforced with glass fibers.

The color converters may optionally comprise further constituents, such as a backing layer.

Backing layers serve to impart mechanical stability to the color converter. The type of material for the backing layers is not crucial, provided that it is transparent and has the desired mechanical strength. Suitable materials for backing layers are, for example, glass or transparent rigid organic polymers, such as polycarbonate, polystyrene or polymethacrylates or polymethyl methacrylates.

Backing layers generally have a thickness of 0.1 mm to 10 mm, preferably 0.2 mm to 5 mm, more preferably 0.3 mm to 2 mm.

In one embodiment of the invention, the color converters have at least one barrier layer against oxygen and/or water, as disclosed in WO 2012/152812. Examples of suitable barrier materials for barrier layers are, for example, glass, quartz, metal oxides, SiO$_2$, a multilayer system composed of alternating layers of Al$_2$O$_3$ and SiO$_2$ layers, titanium nitride, SiO$_2$/metal oxide multilayer materials, polyvinyl alcohol, polyacrylonitrile, polyvinylidene chloride (PVDC), liquid crystal polymers (LCP), polystyrene-acrylonitrile (SAN), polybutylene terephthalate (PBT), polybutylene naphthalate (PBN), polyethylene terephthalate (PET), polyethylene naphthalate (PEN), polyvinyl butyrate (PBT), polyvinyl chloride (PVC), polyamides, polyoxymethylenes, polyimides, polyetherimides, epoxy resins, polymers which derive from ethylene-vinyl acetate (EVA) and polymers which derive from ethylene-vinyl alcohol (EVOH).

A preferred material for barrier layers is glass or a multilayer system composed of alternating layers of Al$_2$O$_3$ and SiO$_2$ layers.

Preferably, suitable barrier layers have low permeability for oxygen.

More preferably, suitable barrier layers have low permeability for oxygen and water.

The concentration of the at least one organic fluorescent dye having a structural unit of formula I as defined above is set as a function of the thickness of the polymer layer of the color converter, the type of polymer and the chosen light source. If a thin polymer layer is used, the concentration of the organic fluorescent dye(s) having a structural unit of formula I and, if present, the concentration of the at least one further organic fluorescent dye is generally higher than in the case of a thick polymer layer. If a blue LED is used as light source the concentration of the organic fluorescent dye(s) having a structural unit of formula I and, if present, the concentration of the at least one further organic fluorescent dye is higher in comparison if a white LED is used as light source. In one embodiment of the invention, the color converter is 0.001 to 10 millimetres in thickness, preferably 0.001 to 5 mm and more preferably 0.01 to 3 mm.

In another embodiment, the color converter is 0.2 to 5 millimeters thick, preferably 0.3 to 3 mm and more preferably 0.4 to 2 mm.

In another embodiment, the color converter is 25 to 1000 micrometers (μm) thick, preferably 35 to 400 μm and particularly 50 to 300 μm.

In a most preferred embodiment, the color converter is 50-2000 μm in thickness, preferably 200-1500 μm and more preferably 700 to 1200 μm.

In order to achieve yellow lighting, wherein at most 1% of the total emitted radiant power of the light emitting device is emitted in a wavelength range shorter than 520 nm, the product of weight percentage of the at least one organic fluorescent dye comprising at least one structural unit of formula (I) and thickness of the color converter must satisfy the equation (A)

$$20[\%\times\mu m] \leq w1 \times d \leq 100[\%\times\mu m] \quad (A)$$

wherein w1 is the weight percentage of the at least one organic fluorescent dye comprising at least one structural unit of formula (I) in the polymer matrix based on the total weight of the polymer and d is the thickness of the color converter (μm).

Accordingly, the weight percentage of the at least one organic fluorescent dye comprising at least one structural unit of formula (I) is usually from 0.01 to 2 parts by weight per 100 parts of the polymer matrix material. Preferably, the weight percentage of the at least one organic fluorescent dye comprising at least one structural unit of formula (I) is usually from 0.01 to 0.3 parts by weight per 100 parts of the polymer matrix material.

Preferably, the color converter comprises the at least one further organic fluorescent dye (A) in an amount which satisfies the equation (B)

$$5[\%\times\mu m] \leq w2 \times d \leq 80[\%\times\mu m] \quad (B)$$

wherein w2 is the weight percentage being based on the combined weight all further organic fluorescent dyes (A) based on the total weight of the polymer and d is the thickness of the color converter (μm).

Accordingly, the weight percentage of the combined weight of all further organic fluorescent dyes (A) is usually from 0.002 to 1.6 parts by weight per 100 parts of the polymer matrix material. Preferably, the weight percentage of the at least one organic fluorescent dye comprising at least one structural unit of formula (I) is from 0.002 to 1.0 parts by weight per 100 parts of the polymer matrix material, more preferably 0.002 to 0.5 parts by weight per 100 parts of the polymer matrix material and most preferably 0.002 to 0.2 parts by weight per 100 parts of the polymer matrix material.

The yellow light emitting device according to the invention is characterized by the very low percentage of radiation power falling in a wavelength range shorter than 520 nm.

Of the radiation emitted by the blue LED, at least 99% of the radiation power shorter than 520 nm are absorbed and all or most of it is converted into a longer-wavelength range, so that yellow light is created. The radiation emitted by the white LED comprises two wavelength ranges, i.e. a wavelength range shorter than 520 nm and a wavelength range longer than or equal to 520 nm. Of the radiation in the wavelength range shorter than 520 nm, at least 99% are absorbed and all or most of it converted into a longer-wavelength range so that yellow light is created.

The color converters can be produced by different processes such as extrusion, printing, coating or molding.

In one method, the fluorescent dye comprising at least one structural unit of formula (I), if desired, at least one further fluorescent dye (A) and, if desired the scattering particles (scattering bodies) and other constituents, are mixed in the polymer by extrusion. Subsequently it can be melt processed (extruded) to produce films/plates/injection moulds of fluorescent material in a polymer matrix.

In an alternative method, the polymer, the fluorescent dye comprising at least one structural unit of formula (I), if desired, at least one further fluorescent dye (A) and, if desired the scattering particles (scattering bodies) and other constituents, can be dissolved in a suitable solvent. The solution/dispersion obtained are then coated on a substrate such as glass. After the solvent has dried off, the film is detached from the substrate.

In another alternative method, printing techniques such as ink-jet printing or screen-printing can be used to produce the color converter.

The color converters may be in any desired geometric arrangement. The color converters may, for example, be in the form of films, sheets or plaques. Equally, the matrix containing organic fluorescent colorants may be in droplet form or hemispherical form or in the form of lenses with convex and/or concave, flat or spherical surfaces. "Casting" refers to the embodiment where LEDs or components comprising LEDs are cast or enveloped fully with a polymer comprising organic fluorescent colorant.

If the color converters consist of one layer or they have a laminate structure, the individual layers, in a preferred embodiment, are continuous and do not have any holes or interruptions.

Color converters used according to the invention are used in a remote phosphor setup. In this case, the color converter is spatially separated from the LED. In general, the distance between LED and color converter is from 0.1 cm to 50 cm, preferably 0.2 to 10 cm and most preferably 0.5 to 3 cm. Between color converter and LED may be different media such as air, noble gases, nitrogen or other gases or mixtures thereof.

The color converter may, for example, be arranged concentrically around the LED or have a planar geometry. It may take the form, for example, of a plaque, sheet or film, be in droplet form or take the form of a casting.

Yellow Light Emitting Device

The yellow light emitting device is characterized that at most 1% of the total emitted radiant power is emitted in a wavelength range shorter than 520 nm.

Preferably, at most 0.8%, of the total emitted radiant power of the yellow light emitting device is emitted in a wavelength range shorter than 520 nm.

Preferably, the yellow light emitting device has a wall plug efficiency from at least 25%.

Preferably, when the light source is a white light emitting diode having a correlated color temperature between 2 700 K and 30 000 K, the yellow light's luminous efficiency is greater than 70% of the lumen efficiency of the white light emitting diode, more preferably greater than 75%. In a preferred embodiment of the invention, the lighting device according to the invention does not comprise any filter.

The light emitted by the yellow light emitting device is preferably is characterized by chromaticity coordinates x,y according to the 1931 CIE standard colorimetric system with an ellipse with the following equation and parameters:

$$\frac{((x-h)\cos(A)+(y-k)\sin(A))^2}{(a^2)} + \frac{((x-h)\sin(A)-(y-k)\cos(A))^2}{(b^2)} = 1,$$

where h,k and a,b are the shifts and semi-axis in the x and y directions respectively and A is the angle measured from x axis with h=0.52, k=0.46, a=0.25, b=0.03, A=−42.

A particular advantage of the yellow light emitting device according to the invention is that it can be used for lighting a workspace, where materials which are sensitive to light at wavelengths shorter than 520 nm are handled, e.g. for ambient lighting in a clean room which allows a safe and reproducible resist processing.

Thus, a second aspect of the present invention relates to use of a yellow light emitting device as defined herein above for lighting a workspace for handling material which is sensitive to light at a wavelength range below 520 nm. Since the yellow lighting device according to the invention uses blue light emitted from a blue or white LED as light source and at most 1% of the total emitted radiant power of the yellow light emitting device is emitted in a wavelength range shorter than 520 nm, it can be advantageously used in microelectronic fabrication plants, especially for photoresist processing.

A third aspect of the present invention relates to a method for providing yellow light wherein at most 1% of the total radiant power is within the spectral range of less than 520 nm, the method comprising the steps (i) providing a light source selected from at least one blue light emitting diode with a center wavelength of emission from 400 nm to 480 nm, at least one white light emitting diode having a correlated color temperature between 2 700 K and 30 000 K or combinations thereof;

(ii) providing at least one color converter comprising at least one organic fluorescent dye in a polymer matrix and wherein said at least one organic fluorescent dye comprises at least one structural unit of formula (I)

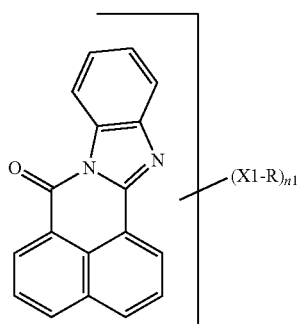

(I)

where one or more CH groups of the six-membered ring of the benzimidazole structure shown may be replaced by nitrogen and where the symbols are each defined as follows:

n1 is a number from 0 to (10-p1) for each structural unit of the formula (I); where p1 is the number of CH units which have been replaced by nitrogen in the six-membered ring of the benzimidazole structure shown X1 is a chemical bond, O, S, SO, $SO_2$, $NR^1$; and R is an aliphatic radical, cycloaliphatic radical, aryl, heteroaryl, each of which may bear substituents, an aromatic or heteroaromatic ring or ring system, each of which is fused to other aromatic rings of the structural unit of the formula (I) or is F, Cl, Br, CN or H when X1 is not a chemical bond;

where two R radicals may be joined to give one cyclic radical and where X1 and R, when n1>one, may be the same or different;

$R^1$ is each independently hydrogen, $C_1$-$C_{18}$-alkyl or cycloalkyl, the carbon chain of which may comprise one or more —O—, —S—, —CO—, —SO— and/or —$SO_2$-moieties and which may be mono- or polysubstituted;

aryl or heteroaryl which may be mono- or polysubstituted;

and mixtures thereof, and wherein the at least one organic fluorescent dye comprising at least one structural unit of formula (I) is capable of absorbing at least a part of the light emitted by the light source and emitting light comprising a wavelength in the range from 520 to 590 nm and wherein the weight percentage of the at least one organic fluorescent dye comprising at least one structural unit of formula (I) in the color converter satisfies the equation (A)

$$20[\%\times\mu m] \le w1 \times d \le 100[\%\times\mu m] \quad (A)$$

wherein w1 is the weight percentage of the at least one organic fluorescent dye comprising at least one structural unit of formula (I) in the polymer matrix based on the total weight of the polymer and d is the thickness of the color converter (μm);

and (iii) arranging the color converter to receive at least a part of the light emitted by the light source.

As to the light source and the color converter reference is made to what is said above.

Preparation of Color Converters

Materials Used:

Light Sources:

LED 1: white LED (Lextar 5000 K tube; tube diameter: 27 mm; tube length: 2 ft/4 ft)

LED 2: blue LED with 450 nm emission (Philips Fortimo)

LED 3: white LED (Toshiba 4918 K)

LED 4: white LED (Toshiba 3092 K)

LED 5: white LED, 4528 K

Color Converter:

PC: transparent polycarbonate based on a polycondensate of bisphenol A and phosgene (PC110 from Chimei or A2200 from Formosa Idemitsu or Makrolon LED 2245 from Covestro).

Titanium dioxide: $TiO_2$ rutile pigment: Kronos® 2233—from Kronos or Kronos® 2230 Polymethylsilsesquioxane: HSP-200, 2 μm, from SAU applied materials, Ltd., Taiwan Dye 1: Yellow fluorescent compound, in the following Dye 1

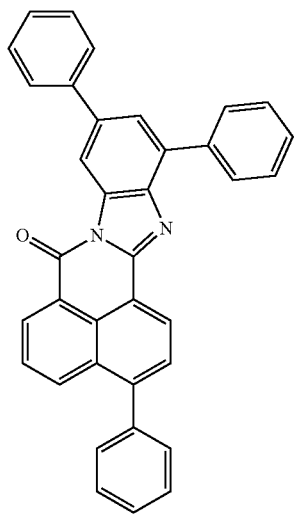

(Dye 1)

obtained as described in example 10 of WO 2012/168395, followed by purification with chromatography. The mixture comprising the compound Dye 1 was subjected to a further column chromatography to give the pure title compound.

Lambda max emission: 536 nm (in polycarbonate).

Dye 2: N,N'-bis(2,6-diisopropylphenyl)-3,4,9,10-perylenetetracarboxylic diimide (CASnumber: 82953-57-9), in the following Dye 2

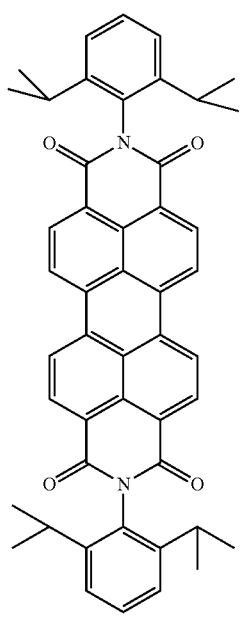

(Dye 2)

Lambda max emission: 548 and 578 nm (in polycarbonate). The compound is commercially available.

Dye 3: N,N'-bis(2,6-diisopropylphenyl)-1,6,7,12-tetraphenoxyperylene-3,4;9,10-tetracarboxylic acid diimide, in the following Dye 3

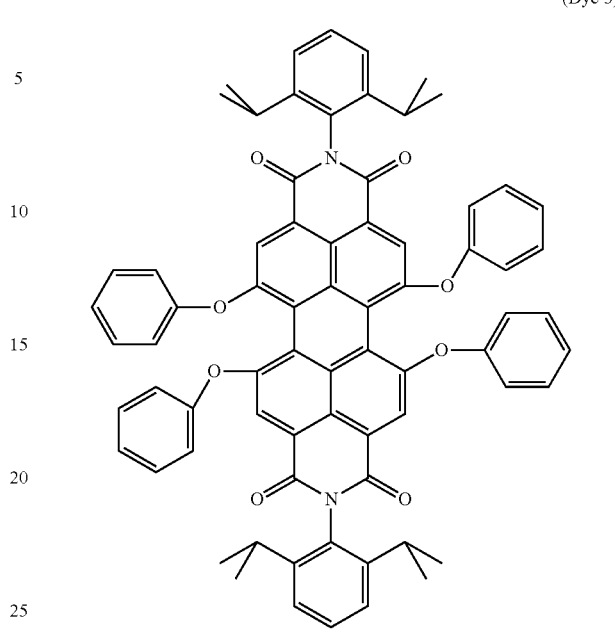

(Dye 3)

commercially available from BASF SE, Germany.

Lambda max emission: 615 nm (in polycarbonate)

Method for Producing Color Converters:

Preparation of Color Converter 1:

For preparation of the color converter 1, polycarbonate (PC110), $TiO_2$ (Kronos® 2233), and dyes according to table II were mixed and compounded into homogeneous pellets by a twin-screw compounder, and after drying the PC-based dyed pellets further extruded into a tube with a circular shape mold. The thickness of extruded tubes was 0.8 mm, and the outer diameter of the tubes was 27 mm

TABLE II

| Color converter 1 | |
|---|---|
| Material | Weight (%) |
| PC110 | 99.820% |
| $TiO_2$ | 0.100% |
| Dye 1 | 0.040% |
| Dye 2 | 0.040% |

Preparation of Color Converters 2 and 3:

For preparation of the color converters, Makrolon polycarbonate, the dyes and $TiO_2$ (Kronos 2233) were extruded together according to the desired concentrations (see Table III). The amounts of materials are given in % by weight based on the amount of polymer polycarbonate. The films were manufactured by extrusion. The film thickness was 222 μm for color converter 2 and 276 μm for color converter 3.

TABLE III

| Color converters 2 and 3 | | |
|---|---|---|
| Material | Col conv 2 | Col conv 3 |
| $TiO_2$ | 0.25% | 0.25% |
| Dye 1 | 0.1% | 0.15% |
| Dye 2 | 0.1% | 0.1% |
| Dye 3 | — | 0.01% |

Preparation of Color Converter 4 and 5:

For preparation of the color converters, PC (A2200), the dyes and $TiO_2$ (Kronos 2230) and polymethysilsesquioxane, respectively were extruded together according to the desired concentrations (see Table IV). The amounts of materials are given in % by weight based on the amount of polymer polycarbonate. The films were manufactured by extrusion. The film thickness was 800 μm in each converter.

TABLE IV

| Color converter 4 and 5 | | |
|---|---|---|
| Material | Color converter 4 | Color converter 5 |
| $TiO_2$ | 0.1% | — |
| Polymethylsilsesquioxane | — | 2.00% |
| Dye 1 | 0.04% | 0.08% |
| Dye 2 | 0.04% | 0.08% |
| PC | 99.82 | 97.84% |

Characterization of the Lighting Devices
The following lighting devices used are:
Lighting Device 1 (LD1):
LED 1 was used as light source for pumping the color converter 1. The color converter 1 (extruded tube) was cut into 2 ft or 4 ft in length, the LED 1 was inserted and fixed into the color converter 1. When lighting up the LED 1, the white color light of LED 1 was absorbed by color converter 1 and then converted into yellow light without any blue light.
Lighting device 2 (LD2): fluorescent lamp Osram L18 W/62 (for comparison)
Lighting device 3 (LD3): Laser tek yellow tube, LED T8 (for comparison)
Lighting device 4 (LD4): HapoLight yellow tube, LED T8 (for comparison)
The light irradiated from the surface of the device was subjected to the photometric measurement, where the total light irradiated from the device was measured by a photometric measurement tool equipped with an integrating sphere, U-1000 (D=100 cm, from AMA Optics, Taiwan), and the CCD spectrometer LE-5400 (from Otsuka, Japan). The measured radiance spectrum was used to derive all relevant photometric data such as CCT (=correlated color temperature) in Kelvin [K], distance of color point from Planck-curve (BBL), luminous efficiency in lumen/watt, wall plug efficiency (=WPE). The results are given in table V.

TABLE V

| | LD 1 | LD2 | LD3 | LD4 |
|---|---|---|---|---|
| Lumens [lm] | 952.0885 | 734.658 | 520.1471 | 1331.9 |
| radiant power [W] | 2.4022 | 1.88046 | 1.49422 | 3.9847089 |
| CCT[K] | 2010 | 2072 | 2000 | 1943 |
| CIE x | 0.5509 | 0.5457 | 0.551 | 0.556 |
| CIE y | 0.4469 | 0.4505 | 0.4453 | 0.4422 |
| CIE u' | 0.3035 | 0.2984 | 0.3043 | — |
| CIE v' | 0.5539 | 0.5543 | 0.5534 | — |
| duv | 0.010312 | 0.011071 | 0.009911 | 0.0094 |
| Voltage[V] | 110.36 | 110.34 | 110.36 | 277 |
| Current[A] | 0.087799 | 0.1677 | 0.093269 | 0.0812 |
| lm/W | 101.4014 | 41.4218 | 52.2068 | 64.7 |
| WPE[%] | 25.58 | 10.6 | 15.0 | 19.36 |

Table V shows that the inventive light source LD1 as well as the comparison light sources LD2, LD3 and LD4 are too far away from the Planckian locus to be perceived as white. In addition, the inventive light emitting device exhibits significantly higher values of the luminous efficiency and of wall plug efficiency than prior art light emitting devices. In particular, the luminous efficiency is 244% higher for the inventive light emitting device compared to the prior art light emitting device LD2 which uses a filter.

FIG. 1 shows that LD1 and LD2 nearly have no emission in the spectral range below 520 nm.

The following table VI compares the radiation power of the inventive LD1 and comparison LD 2 in the critical spectral ranges below 520 nm where no wavelengths are desired:

TABLE VI

| | LD1 | LD2 |
|---|---|---|
| Radiant Power (mW) | 2383 | 1880 |
| <500 nm (μW) | 4252 | 4310 |
| Ratio <500 nm | 0.18% | 0.23% |
| <520 nm (μW) | 5050 | 5041 |
| Ratio <520 nm | 0.21% | 0.27% |

Table VI shows that the inventive light emitting device better eliminates radiation power below 520 nm than the prior art light emitting device LD2.

For the measurement of color converters 2 and 3 LED2 was used as a backlight. The light irradiated from the surface of the device was subjected to the photometric measurement, where the total light irradiated from the device was measured by a photometric measurement tool equipped with an integrating sphere, ISP 500-100, and the CCD detector CAS 140CT-156 (from Instrument Systems, Munich). The measured radiance spectrum was used to derive all relevant photometric data such as CCT (=correlated color temperature) in Kelvin [K], distance of color point from Planck-curve (BBL), luminous efficiency, wall plug efficiency. The results are given in table VII.

TABLE VII

| Photometric data for color converter 2 using blue LED 2 | | | | | | |
|---|---|---|---|---|---|---|
| | CIE-x | CIE-y | CIE-u' | CCT [K] | duv | Absorbance LED 2 |
| LED 2 | 0.1538 | 0.0236 | 0.2068 | | | |
| LED2 + col conv 2 | 0.5192 | 0.4712 | 0.2727 | 2429 | 1.66E−02 | 99.57% |
| LED2 + col conv 3 | 0.6033 | 0.3929 | 0.3708 | 1410 | 2.32E−03 | 99.90% |

Table VII shows that >99% of the blue light are absorbed by both color converter 2 and 3, respectively.

For the measurement of the color converter 4 LED3 and LED4 were used as a backlight. Lighting device 5 (LD5):
LED 3 was used as light source for pumping the color converter 4. When lighting up the
LED 3, the white color light of LED 3 was absorbed by color converter 4 and then converted into yellow light.
Lighting device 6 (LD6):
LED 4 was used as light source for pumping the color converter 4. When lighting up the
LED 4, the white color light of LED 4 was absorbed by color converter 4 and then converted into yellow light.
Lighting Device 7 (LD7):
LED 5 was used as light source for pumping the color converter 5. When lighting up the LED 5, the white color light of LED 5 was absorbed by color converter 5 and then converted into yellow light.

The light irradiated from the surface of the device was subjected to the photometric measurement, where the total light irradiated from the device was measured by aphotometric measurement tool equipped with an integrating sphere, ISP 500-100, and the CCD detector CAS 140CT-156 (from Instrument Systems, Munich). The measured radiance spectrum was used to derive all relevant photometric data such as CCT (=correlated color temperature) in Kelvin [K], distance of color point from Planck-curve (BBL), luminous efficiency and wall plug efficiency. The results are given in tables VIII and IX.

TABLE VIII

|  | LED3 | LD5 | LED4 | LD6 |
|---|---|---|---|---|
| Lumens | 973.68 | 982.2141 | 982.0691 | 795.8411 |
| Radiation[W] | 3.24616 | 2.64385 | 3.4103 | 2.62395 |
| CCT[K] | 4918 | 1995 | 3092 | 1774 |
| CIE x | 0.3483 | 0.5517 | 0.4303 | 0.5696 |
| CIE y | 0.3605 | 0.4454 | 0.401 | 0.4279 |
| CIE u' | 0.2102 | 0.3048 | 0.2476 | 0.3257 |
| CIE v' | 0.4894 | 0.5536 | 0.5192 | 0.5505 |
| duv | 0.003141 | 0.009969 | −0.000295 | 0.006725 |
| Voltage[V] | 110.37 | 110.37 | 110.37 | 110.37 |
| Current[A] | 0.092896 | 0.092291 | 0.091405 | 0.091355 |
| lm/W | 103.626 | 105.0732 | 105.6886 | 85.7116 |
| WPE[%] | 34.55 | 28.28 | 36.7 | 28.26 |
| Blue Light Reduction |  | 99.4% | 47.7% | 99.5% |
| Blue Light Integration[mW] | 610 | 4 | 319 | 3 |
| Red Light Integration[mW] | 2094 | 2172 | 2503 | 2153 |

TABLE IX

| 10 W Yellow Tube | LED 5 | LD7 |
|---|---|---|
| Lumens | 1393.6833 | 1019.4759 |
| Radiation[W] | 4.34935 | 2.80565 |
| CCT[K] | 4528 | 1854 |
| CIE x | 0.3606 | 0.5631 |
| CIE y | 0.3664 | 0.4347 |
| CIE u' | 0.2161 | 0.3177 |
| CIE v' | 0.494 | 0.5518 |
| duv | 0.001467 | 0.007894 |
| Voltage [V] | 110.33 | 110.33 |
| Current [A] | 0.091979 | 0.092157 |
| lm/W | 138.3034 | 100.9782 |
| WPE[%] | 43.16 | 27.79 |
| Power Consumption [W] | 10.1 | 10.1 |

The invention claimed is:

1. A yellow light emitting device, comprising:
   (i) a light source comprising a blue light emitting diode with a center wavelength of emission in a range of from 400 nm to 480 nm, and/or a white light emitting diode having a correlated color temperature between in a range of from 2 700 to 30 000 K;
   (ii) a color converter comprising an organic fluorescent dye in a polymer matrix, the organic fluorescent dye comprising a structural unit of formula (I)

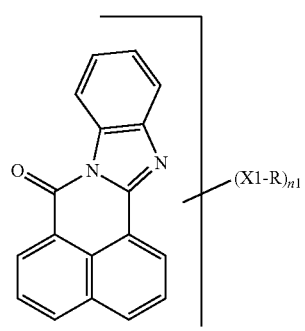

(I)

wherein one or more CH groups of the six-membered ring of the benzimidazole structure are optionally replaced by nitrogen and wherein
   n1 is a number from 0 to (10-p1) for each structural unit of the formula (1), p1 being a number of the CH groups replaced by nitrogen in the six-membered ring of the benzimidazole structure,
   X1 is a chemical bond, O, S, SO, $SO_2$, or $NR^1$, and
   R is an aliphatic radical, cycloaliphatic radical, aryl, or heteroaryl, or an aromatic or heteroaromatic ring or ring system, fused to other aromatic rings of the structural unit of the formula (I), or F, Cl, Br, CN, or H when X1 is not a chemical bond, two R radicals optionally being joined to give one cyclic radical,
   X1 and R, when n1>one, optionally being the same or different;
   $R^1$ is independently hydrogen, $C_1$-$C_{18}$-alkyl or cycloalkyl, the carbon chain of which optionally comprising an —O—, —S—, —CO—, —SO— and/or —$SO_2$— moiety, or aryl or heteroaryl
   wherein the organic fluorescent dye absorbs at least a part of light emitted by the light source and emits light comprising a wavelength in a range of from 520 to 590 nm,
   wherein the organic fluorescent dye in the color converter has a weight percentage satisfying equation (A)

$$20[\%\times\mu m] \leq w1 \times d \leq 100[\%\times\mu m] \quad (A),$$

wherein w1 is the weight percentage of the organic fluorescent dye in the polymer matrix, based on total polymer weight, and d is thickness of the color converter in μm,
   wherein at most 1% of total emitted radiant power of the yellow light emitting device is emitted in a wavelength range shorter than 520 nm, and
   wherein the yellow-light emitting device has a luminous efficiency of at least 80 lumen/watt.

2. The device of claim 1, wherein at most 0.8% of the total emitted radiant power is emitted in a wavelength range shorter than 520 nm.

3. The device of claim 1, having a wall plug efficiency from at least 25%.

4. The device of claim 1, wherein the light source is a white light emitting diode having a correlated color temperature in a range of from 2 700 to 30 000 K, and
   wherein the yellow light's luminous efficiency is greater than 70% of a luminous efficiency of the white light emitting diode.

5. The device of claim 1, suitable to emit a light spectrum having chromaticity coordinates x,y according to the 1931 CIE standard colorimetric system with an ellipse of an equation and parameters:

$$\frac{((x-h)\cos(A)+(y-k)\sin(A))^2}{(a^2)} + \frac{((x-h)\sin(A)-(y-k)\cos(A))^2}{(b^2)} = 1,$$

wherein h and k, and a and b are the shifts and semi-axis in x and y directions respectively and A is an angle measured from x axis, wherein h is 0.52, k is 0.46, a is 0.25, b is 0.03, and A is −42.

6. The device of claim 1, wherein the organic fluorescent dye comprises a compound of formula (I-5) and/or (I-7):

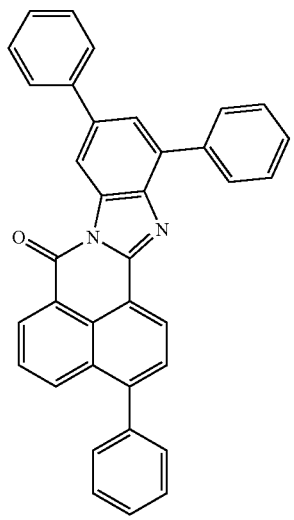

(I-5)

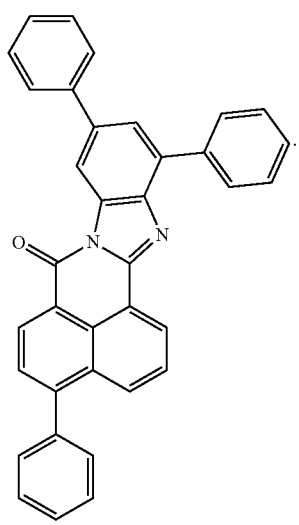

(I-7)

7. The device of claim 1, wherein the color converter comprises a further organic fluorescent dye (A) comprising (a) a perylene-3,4,9,10-tetracarboxylic acid diimide compound of formula (II)

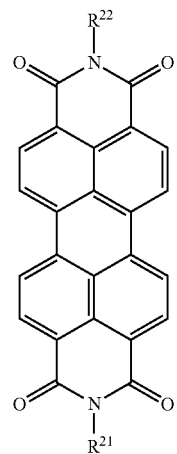

(II)

wherein
R$^{21}$ and R$^{22}$ are independently C$_1$-C$_{30}$-alkyl, C$_3$-C$_8$-cycloalkyl, C$_6$-C$_{14}$-aryl, hetaryl, or C$_6$-C$_{14}$-aryl-C$_1$-C$_{10}$-alkylene, the (hetero)aromatic ring being optionally substituted by a C$_1$-C$_{10}$-alkyl;

(b) an aryloxy-substituted perylene-3,4,9,10-tetracarboxylic acid diimide compound of formula (III)

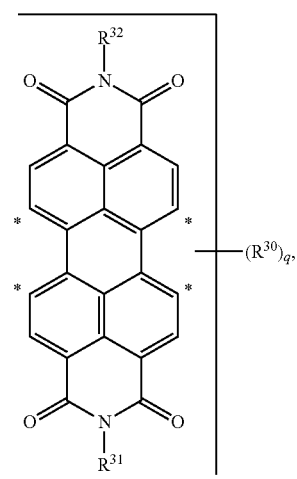

(III)

wherein
q is 1 to 4,
R$^{30}$ is aryloxy optionally substituted by halogen, C$_1$-C$_{10}$-alkyl, or C$_6$-C$_{10}$-aryl, the R$^{30}$ radicals being at one or more position indicated by *,
R$^{31}$ and R$^{32}$ are independently C$_1$-C$_{30}$-alkyl, C$_3$-C$_8$-cycloalkyl, C$_6$-C$_{14}$-aryl, hetaryl, or C$_6$-C$_{14}$-aryl-C$_1$-C$_{10}$-alkylene, where the (hetero)aromatic ring being optionally substituted by C$_1$-C$_{10}$-alkyl;

(c) a core-cyanated naphthoylbenzimidazole compound of formula (IV)

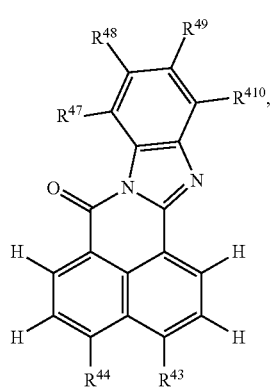

(IV)

wherein
one of $R^{43}$ or $R^{44}$ is independently cyano and the other radical $R^{43}$ or $R^{44}$ is cyano, phenyl, 4-cyanophenyl, or phenyl comprising 1, 2, or 3 $C_1$-$C_{10}$-alkyl substituents,
$R^{47}$, $R^{48}$, $R^{49}$, and $R^{410}$ are independently of each other are hydrogen, cyano, phenyl, 4-cyanophenyl, or phenyl comprising 1, 2, or 3 $C_1$-$C_{10}$-alkyl substituents, and/or
(d) a perylene-3,4,9,10-tetracarboxylic acid diimide compound with rigid 2,2'-biphenoxy bridges of formula (V)

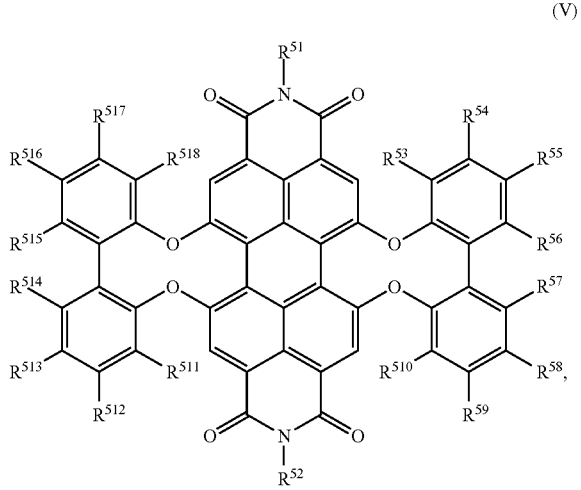

(V)

wherein
$R^{51}$ and $R^{52}$ are independently hydrogen, $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl, $C_6$-$C_{24}$-aryloxy,
$R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$ and $R^{518}$ are independently hydrogen, halogen, cyano, hydroxyl, mercapto, nitro, -$NE^{51}E^{52}$, —$NR^{Ar51}COR^{A52}$, —$CONR^{Ar51}R^{Ar52}$, —$SO_2NR^{A51}R^{A52}$, —$COOR^{Ar51}$, —$SO_3R^{Ar52}$, $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy, or $C_6$-$C_{24}$-arylthio,
wherein $R^{53}$ and $R^{54}$, $R^{54}$ and $R^{55}$, $R^{55}$ and $R^{56}$, $R^{56}$ and $R^{57}$, $R^{57}$ and $R^{58}$, $R^{58}$ and $R^{59}$, $R^{59}$ and $R^{510}$, $R^{511}$ and $R^{512}$, $R^{512}$ and $R^{513}$, $R^{513}$ and $R^{514}$, $R^{55}$ and $R^{515}$, $R^{515}$ and $R^{516}$, $R^{516}$ and $R^{517}$, and/or $R^{517}$ and $R^{518}$, together with the carbon atoms of the biphenylyl moiety to which they are bonded, optionally form a further fused ring system,
wherein $E^{51}$ and $E^{52}$ are independently hydrogen, $C_1$-$C_{18}$-alkyl, $C_2$-$C_{18}$-alkenyl, $C_2$-$C_{18}$-alkynyl, $C_3$-$C_{20}$-cycloalkyl, or $C_6$-$C_{10}$-aryl, and
$R^{Ar51}$ and $R^{Ar52}$ are independently hydrogen, $C_1$-$C_{18}$-alkyl, $C_3$-$C_{20}$-cycloalkyl, heterocyclyl, $C_6$-$C_{20}$-aryl, or heteroaryl.

8. The device of claim 7, wherein the further organic fluorescent dye comprises the compound of formula (II) and/or the compound of formula (III).

9. The device of claim 7, wherein $R^{21}$ and $R^{22}$ in the compound of formula II are independently $C_1$-$C_{18}$-alkyl, phenyl, or naphthyl, the phenyl or naphthyl being optionally substituted by 1, 2, or 3 $C_1$-$C_4$-alkyl radicals.

10. The device of claim 7, wherein in the compound of formula (III) is present, and
$R^{30}$ is phenoxy, optionally substituted by 1 or 2 fluorine, chlorine, $C_1$-$C_{10}$-alkyl, or phenyl,
$R^{31}$ and $R^{32}$ are each independently $C_1$-$C_{10}$-alkyl, 2,6-di($C_1$-$C_{10}$-alkyl)phenyl, or 2,4-di($C_1$-$C_{10}$-alkyl)phenyl, and
q is 2, 3, or 4.

11. The device of claim 7, wherein the color converter comprises the further organic fluorescent dye (A) in an amount satisfying equation (B)

$$5[\%\times\mu m] \le w2 \times d \le 80[\%\times\mu m] \quad (B),$$

wherein w2 is a weight percentage based on a combined weight of all further organic fluorescent dyes and the total polymer weight, and d is a thickness of the color converter in µm.

12. The device of claim 1, wherein the polymer matrix comprises a polystyrene, polycarbonate, polyacrylate, polymethylmethacrylate, polymethacrylate, polyvinylpyrrolidone, polyvinyl acetate, polyvinyl chloride, polybutene, silicone, epoxy resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, 2,5-furandicarboxylate polyester, polyvinyl butyrate, polyvinyl chloride, polyamide, polyoxymethylene, polyimide, and/or polyetherimide.

13. The device of claim 1, wherein the color converter comprises a light scattering agent.

14. The device of claim 1, wherein the color converter comprises an inorganic luminescent material comprising quantum dots, garnets, silicates, sulfides, nitrides, and/or oxynitrides.

15. The device of claim 1, wherein the polymer matrix comprises polystyrene, polycarbonate, polyethylene terephthalate, or polyethylene furanoate.

16. The device of claim 1, wherein the color converter comprises a poly(methyl methacrylate)-based scattering agent, silicone-based scattering agent, or $TiO_2$.

17. A workspace configured for handling material sensitive to light at wavelengths below 520 nm, the workspace comprising:
the device of claim 1.

18. A method of providing yellow light, wherein at most 1% of total radiant power is within a spectral range of less than 520 nm, the method comprising:
arranging, to receive at least a part of light emitted by a light source comprising a blue light emitting diode with a center wavelength of emission in a range of from 400 nm to 480 nm and/or a white light emitting diode having a correlated color temperature in a range of from 2 700 to 30 000 K;

a color converter comprising an organic fluorescent dye in a polymer matrix, the organic fluorescent dye comprising a structural unit of formula (I)

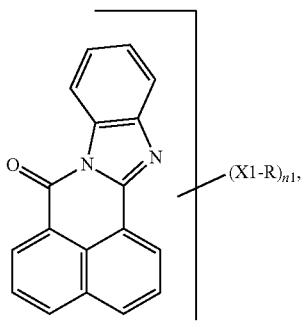

(I)

wherein one or more CH groups of the six-membered ring of the benzimidazole structure is optionally replaced by nitrogen, n1 is a number from 0 to (10-p1) for each structural unit of the formula (I); p1 being a number of the CH units replaced by nitrogen in the six-membered ring of the benzimidazole structure, X1 is a chemical bond, O, S, SO, $SO_2$, or $NR^1$, and R is an aliphatic radical, cycloaliphatic radical, aryl, or heteroaryl, or an aromatic or heteroaromatic ring or ring system, fused to other aromatic rings of the structural unit of the formula (I), or F, Cl, Br, CN, or H when X1 is not a chemical bond, two R radicals being optionally joined to give one cyclic radical, X1 and R, when n1>one, being the same or different, $R^1$ is independently hydrogen, $C_1$-$C_{18}$-alkyl, or cycloalkyl, the carbon chain of which optionally comprising an —O—, —S—, —CO—, —SO—, and/or —$SO_2$ moiety, or aryl or heteroaryl, and wherein the organic fluorescent dye is capable of absorbing at least a part of the light emitted by the light source and emitting light comprising a wavelength in a range of from 520 to 590 nm, wherein the organic fluorescent dye has a weight percentage in the color converter satisfying equation (A)

$$20[\%\times\mu m] \leq w1 \times d \leq 100[\%\times\mu m] \quad (A),$$

wherein w1 is a weight percentage of the organic fluorescent dye in the polymer matrix based on total polymer weight, and d is a thickness of the color converter in μm.

19. The method of claim 18, wherein the organic fluorescent dye comprises a compound of formula (I-5) and/or (I-7):

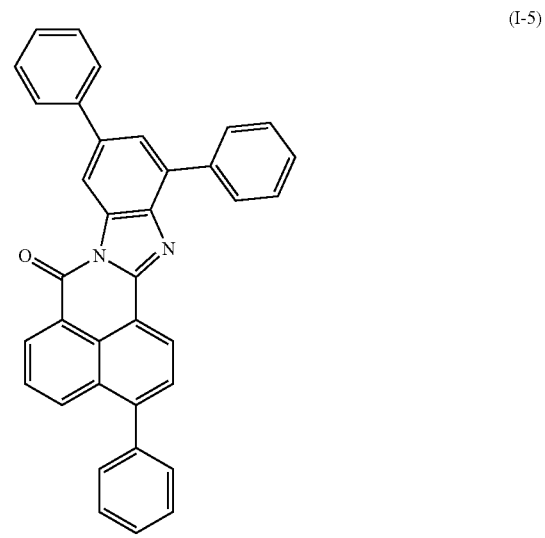 [SMILES: O=c1c2cccc3c(-c4ccccc4)ccc(c32)c2nc3c(-c4ccccc4)cc(-c4ccccc4)cc3n12]

(I-5)

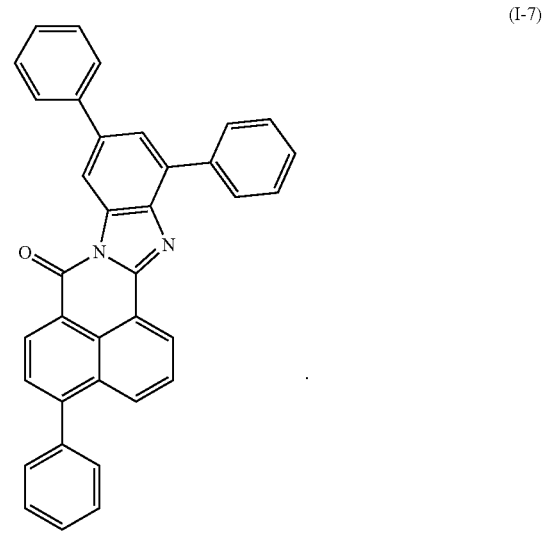

(I-7)

* * * * *